United States Patent
Mari Curbelo et al.

(10) Patent No.: US 9,209,618 B2
(45) Date of Patent: Dec. 8, 2015

(54) GATE DRIVE UNIT AND METHOD FOR SHORT CIRCUIT PROTECTION FOR A POWER SWITCH

(71) Applicant: General Electric Company, Schenectady, NY (US)

(72) Inventors: Alvaro Jorge Mari Curbelo, Bavaria (DE); Thomas Alois Zoels, Bayern (DE); Miguel Garcia Clemente, Bayern (DE); Philipp Leuner, Bayern (DE); Nicolas Wannenmacher, Bavaria (DE)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/273,106

(22) Filed: May 8, 2014

(65) Prior Publication Data

US 2015/0326009 A1 Nov. 12, 2015

(51) Int. Cl.
*H01L 29/00* (2006.01)
*H02H 9/04* (2006.01)
*H02M 1/32* (2007.01)

(52) U.S. Cl.
CPC .. *H02H 9/04* (2013.01); *H02M 1/32* (2013.01)

(58) Field of Classification Search
CPC . H01L 25/112; H01L 25/115; H01L 27/0727; H01L 23/647; H03K 17/08; H03K 17/0812; H03K 17/0822; H02H 9/04; H02M 1/32
USPC .......................... 257/536, 379, 139; 361/93.9
See application file for complete search history.

(56) References Cited

U.S. PATENT DOCUMENTS

| | | | |
|---|---|---|---|
| 6,097,582 A * | 8/2000 | John et al. ........................ 361/79 |
| 6,396,721 B1 | 5/2002 | Sonoda et al. |
| 7,777,370 B2 | 8/2010 | Kojori et al. |
| 8,446,206 B2 | 5/2013 | Alvarez Valenzuela et al. |
| 8,503,146 B1 | 8/2013 | Shekhawat |
| 2010/0019807 A1 | 1/2010 | Zhang et al. |

(Continued)

FOREIGN PATENT DOCUMENTS

WO 2009118201 A2 10/2009

OTHER PUBLICATIONS

IGBT-Driver.com; Concept AN-1101; "Application with SCALE-2 Gate Driver Cores", Single and Dual-Channel SCALE-2 IGBT and MOSFET Driver Cores.

(Continued)

*Primary Examiner* — Tu-Tu Ho
(74) *Attorney, Agent, or Firm* — Joseph J. Christian

(57) ABSTRACT

A gate drive unit includes a measurement unit, a multi-resistive driving device, and a processing unit. The measurement unit measures a voltage across main terminals of a power switch. The driving device includes plural individually controllable resistive elements. The processing unit controls a control voltage applied to a control electrode of the power switch to activate the power switch. The processing unit individually activates or deactivates the resistive elements of the multi-resistive driving device to change which of the resistive elements at least partially conducts the control voltage to the power switch at different times responsive to the voltage across the main terminals representing a short circuit event. The processing unit changes which of the resistive elements are activated or deactivated to control a rate at which the control voltage decreases.

23 Claims, 8 Drawing Sheets

(56) References Cited

U.S. PATENT DOCUMENTS

2013/0063995 A1 3/2013 Norrga et al.
2013/0187656 A1 7/2013 Jens Barrenscheen et al.

OTHER PUBLICATIONS

Bodo's Power Systems, Oct. 2013, www.bodospower.com; "Using Advanced Active Clamping to Facilitate Simple, Safe and Reliable IGBT Driving in Multi-Level Topologies", Olivier Garcia, CT-Concept Technologie GmbH.

IEEE Transactions on Power Electronics, vol. 23, No. 2, Mar. 2008, Petar J. Grbovic; "An IGBT Gate Driver for Feed-Forward Control of Turn-on Losses and Reverse Recovery Current".

Abdus Sattar, IXYS Corporation, IXAN0063; "Insulated Gate Bipolar Transistor (IGBT) Basics".

http://www.abb.com/product/seitp322; ABB Gate Drive for IGBT—Gate Drivers & Power Supplies; "Gate Drive for IGBT".

Plasma Science, IEEE Transactions on, "Gate Unit with Improved Short-Circuit Detection and Turn-Off Capability for 4.5-kV Press-Pack IGBTs Operated at 4-kA Pulse Current", Oct. 2013; Gerber et al. vol. 41, Issue 10, p. 2641-2648.

Power Electronics and Applications, 1993., Fifth European Conference on, "Optimization of the turn-off performance of IGBT at overcurrent and short-circuit current", Sep. 1993; Eckel et al., vol. 2, p. 317-322.

Industrial Electronics, IEEE Transactions, "A Failure-Detection Strategy for IGBT Based on Gate-Voltage Behavior Applied to a Motor Drive System", May 2011; Rodriguez-Blanco et al.; vol. 58, Issue 5, p. 1625-1633.

* cited by examiner

GATE DRIVE UNIT AND METHOD FOR SHORT CIRCUIT PROTECTION FOR A POWER SWITCH

FIELD

Embodiments of the subject matter described herein relate to switches, such as power switches used to control conduction of electric current in a circuit, such as a circuit that includes a high power converter or other component. One or more aspects described herein relate to voltage controlled power semiconductor switches like MOSFETs, IGBTs and reverse conducting IGBTs

BACKGROUND

Switches in circuits alternate between activated or on states, where the switches are closed to conduct electric current from a source of the current to one or more loads, and deactivated or off states, where the switches are opened to prevent conduction of the electric current. These switches and/or the circuits that include the switches may encounter a variety of different short circuits in different locations of the circuits. Depending on the type and severity of the short circuit, the switch can be damaged or destroyed.

Some different types of short circuits require different protection schemes to prevent damage or destruction of the switch. Current protection devices such as fuses, gate drivers, or the like, may be insufficient to protect the switches when certain short circuits are encountered.

For example, some short circuits occur when the switch is initially activated or turned on. These short circuits occur relatively quickly and, in circuits where a relatively large amount of current is conducted, can damage or destroy the switch very rapidly. Fuses in these types of circuits may be unable to blow in time to prevent the large currents from damaging or destroying the switch.

Some other short circuits occur after the switch is closed and current is being conducted through the switch to the load. These short circuits can be dangerous to the switch in that the switch may be saturated with current and unable to merely switch off the conduction of the current. Abruptly eliminating or reducing the voltage used to control the switch (e.g., a gate voltage) can result in the switch being damaged or destroyed.

One known attempt at protecting switches from short circuits includes active clamping, which protects the switch from overvoltage at a short circuit turn-off. But, active clamping can require intensive tuning of an analog circuit and optimal performance for all operational conditions, which can be difficult, if not impossible, to achieve.

BRIEF DESCRIPTION

In one example of the inventive subject matter described herein, a gate drive unit for operation of a converter is provided. The gate drive unit includes a measurement unit, a multi-resistive driving device, and a processing unit. The measurement unit is configured to measure a first voltage across main terminals of a power switch. The multi-resistive driving device is conductively coupled with a control electrode of the power switch. The multi-resistive driving device includes plural individually controllable resistive elements conductively coupled between a voltage source and the control electrode of the power switch. The processing unit is configured to control a control voltage that is applied to the control electrode of the power switch by the voltage source to activate the power switch. The processing unit also is configured to individually activate or deactivate the resistive elements of the multi-resistive driving device to change which of the resistive elements at least partially conduct the control voltage from the voltage source to the control electrode of the power switch at different times responsive to the first voltage across the main terminals of the power switch representing a first type of short circuit event. The processing unit also is configured to change which of the resistive elements are activated or deactivated to control a rate at which the control voltage decreases during deactivation of the power switch responsive to a first type of a short circuit event occurring.

In another example of the inventive subject matter described herein, a method for providing short circuit protection includes monitoring a rate of change in current conducted through main terminals of a power switch, determining when the rate of change in the current is faster than a designated detection rate, and responsive to the rate of change in the current exceeding the designated detection rate, changing which of plural individually controllable resistive elements in a multi-resistive driving device are active to at least partially conduct a control voltage supplied to a control electrode of the power switch at different times. Changing which of the resistive elements are active at different times controls a rate at which the control voltage supplied to the control electrode of the power switch decreases.

In another example of the inventive subject matter, a method includes monitoring a rate of change in current conducted through main terminals of a power switch, determining when the rate of change in the current is faster than a designated detection rate, and responsive to the rate of change in the current exceeding the designated detection rate, lowering a control voltage to an intermediate level, followed by increasing the control voltage to an increased level after at least one of expiration of a second time period after the control voltage is lowered to the intermediate level, the rate of change in the current decreases below a first designated threshold, or a voltage across the power switch increases above a second designated threshold. The control voltage is lowered by changing which of plural individually controllable resistive elements in a multi-resistive driving device are active to at least partially conduct a control voltage supplied to a control electrode of the power switch at different times. The method also can include turning off a short circuit current by controlling a decreasing slope of the control voltage after a third designated time period when the voltage across the power switch is above a third designated threshold.

In another example of the inventive subject matter, a method (e.g., for providing short circuit protection) includes measuring a first voltage across main terminals of a power switch and, responsive to the first voltage across the main terminals of the power switch representing a first type of short circuit event, individually activating or deactivating resistive elements of a multi-resistive driving device coupled between a voltage source and a control electrode of the power switch. The resistive elements are individually activated or deactivated to change which of the resistive elements at least partially conduct a control voltage from the voltage source to the control electrode of the power switch at different times. Individually activating or deactivating the resistive elements decreases the control voltage at a controlled rate.

In another example of the inventive subject matter described herein, a gate drive unit for operation of a converter includes a measurement unit, a multi-resistive driving device, and a processing unit. The measurement unit is configured to measure a first voltage across main terminals of a power switch. The multi-resistive driving device is configured to be conductively coupled with a control electrode of the power switch that receives a control voltage to activate the power switch. The multi-resistive driving device includes plural individually controllable resistive elements conductively coupled between a voltage source that provides the control voltage and the control electrode of the power switch. The processing unit is configured to individually activate or deactivate the resistive elements of the multi-resistive driving device to divide the control voltage applied to the control electrode of the power switch among different sets of the resistive elements at different times to reduce the control voltage and deactivate the power switch responsive to the first voltage across the main terminals of the power switch indicating a first type of short circuit event. The processing unit is configured to control a rate at which the control voltage decreases during deactivation of the power switch based on a magnitude of the first voltage across the main terminals of the power switch.

BRIEF DESCRIPTION OF THE DRAWINGS

The subject matter described herein will be better understood from reading the following description of non-limiting embodiments, with reference to the attached drawings, wherein below.

DETAILED DESCRIPTION

Figure 1:
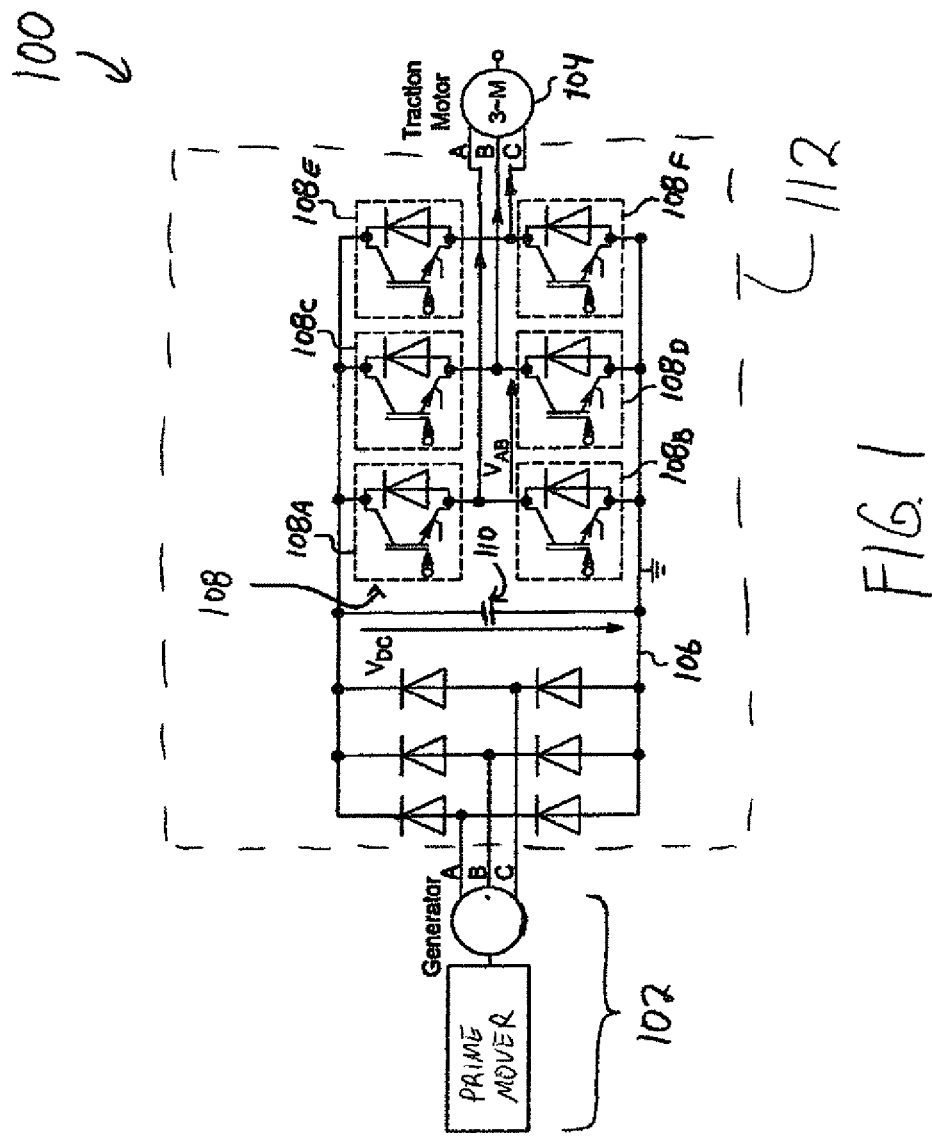
FIG. 1 illustrates a circuit diagram of a power traction converter circuit according to one example of the inventive subject matter described herein.

One or more embodiments of the inventive subject matter described herein relate to gate drive units and methods that provide protection to power switches in the event of one or more different types of short circuits, such as semiconductor power switches like insulated gate bipolar transistors (IGBTs) in power converters. While the description herein focuses on semiconductor power switches like IGBTs, not all embodiments of the inventive subject matter are so limited. Various aspects of the inventive subject matter described herein may be used to provide short circuit protection to other types of power switches.

In one aspect, a measurement unit detects a short circuit, a programmable driving stage or device controls a control voltage applied to a control electrode of a power switch, and a processing unit, such as a field programmable gate array (FPGA) or other type of processor, for controlling the driving stage or device. The control voltage optionally can be referred to as a gate voltage, an activation voltage, or the like, because this voltage activates or deactivates the power switch. For example, application of the control voltage to the control electrode of the power switch may activate the power switch to conduct voltage between main terminals of the power switch. The driving stage or device may be referred to as a multi-resistive driving device in at least one embodiment. The system and method can distinguish between different types of short circuits in a circuit that includes a power converter (e.g., a power supply or source) and an electric load. The system and method can then provide different protection mechanisms for the different types of short circuits that are detected. The responsiveness in providing the protection against the short circuit can be provide faster than at least some currently known short circuit protection mechanisms and, as a result, the stress on the power switch can be reduced and destructive damage of the switch avoided during short circuit events.

One type of short circuit (also referred to as a short circuit event) can occur when the power switch is turned on (e.g., activated) to conduct current. This type of short circuit can be referred to as a first type of short circuit event, or SC1. An SC1 event can be detected by measuring voltage across the main terminals of the power switch. In case of an SC1 event, at least one blocking element of the circuit has failed into a conductive state while the named power switch is in off-state. When the named power switch is afterwards turned on, a low impedance loop through an energy supplying element is closed which leads to a current through the power switch main terminals which exceeds the current levels that appear in normal operation. Some types of power semiconductor switches like MOSFETs and IGBTs are limiting the short circuit current to a controlled level by desaturation, which means taking up voltage across the main terminals of the power switch, and going into a mode of limiting the short circuit current through the power switch main terminals. In one type of power converters named voltage source converters the energy supplying element can be a DC-link capacitor. The failed blocking element can be another power switch in the same converter leg which is controlled to be turned off but is in a conductive state. In one example, a collector-emitter voltage of the power switch may be measured. When the voltage across the power switch main terminals is still above a certain threshold (e.g. 40 volts or another threshold) after a designated time period ($t_1$, such as eight microseconds or another length of time), then an SC1 event is detected by the gate drive unit, and the gate drive unit enacts a protective turn-off procedure of the power switch. As described below, this protective turn-off procedure can include controlling the rate or slope at which the control voltage ($V_{ge}$) decreases. In at least one embodiment, such a procedure can be referred to as a "soft turn off."

On the other hand, if the voltage across the power switch main terminals is below the threshold after the designated time period, a successful turn-on is recognized by the processing unit and the SC1 event is not identified.

Another type of short circuit event can occur after the power switch is turned on and excessive current is at least initially conducted through the power switch. This short circuit event can be referred to as a second short circuit event or SC2 event. The SC2 event can occur after a successful turn on of the switch (e.g., after no SC1 event is detected). The SC2 event can be detected when the voltage across the power switch exceeds the threshold after the blanking time period while the power switch is still turned on to conduct current. The SC2 event also can be detected in another manner, such as when the control terminal current flows back into the driver, the control terminal voltage exceeds a reference voltage (e.g., the on static operation voltage, such as +15V, or the like).

The SC2 event can be caused by a variety of factors, such as an external short in the load, an internal short of the opposed power switch in a converter leg, a short in a bus bar of the circuit, or another factor. Damage to the power switch from the SC2 event can be more severe than the damage caused by the SC1 event because the current and voltage levels of the power switch main terminals can be larger. The rising voltage across the power switch main terminals during desaturation, meaning the power switch changes into current limitation mode, feeds current into the control electrode of the power switch through the Miller effect, which can pull the control voltage applied to the control electrode at the power switch above the voltage provided from the voltage source. This can lead to an overshoot (e.g., increase above an upper safety threshold) of current supplied to the main terminals of the power switch (e.g., a supply current, such as a collector-emitter current, or $I_{ce}$) and very high stress in the power switch. When the voltage across the power switch main terminals reaches a DC-link voltage (e.g., the voltage provided by the capacitors 110), the current through the power switch main terminals ($I_{ce}$) may be decreasing at a relatively rapid and uncontrolled rate to a static short circuit current, which can lead to a high overshoot in the voltage across the power switch main terminals that can be destructive of the power switch. In one aspect, the power switch cannot be turned-off responsive to identifying the SC2 event before the short circuit current reaches a steady state (e.g., is not increasing or decreasing faster than a threshold rate for at least a designated time period). Otherwise, the high overshoot in the voltage across the power switch main terminals can occur.

In response to identifying the SC2 event, another protection procedure can be performed. The processing unit can include a timer or otherwise track passage of time. The processing unit can initiate the timer responsive to detection of the SC2 event. When the timer reaches a predefined value (e.g. four microseconds or another time period), a protective turn-off with controlled control voltage ($V_{ge}$) slope is triggered, similar to as described above. For example, the rate at which the control voltage ($V_{ge}$) is decreased is controlled after expiration of this time period to ensure that the short circuit current has reached steady state. The control voltage ($V_{ge}$) is controlled to slowly decrease to prevent overshoot of the voltage across the power switch main terminals. Optionally, the voltage across the power switch main terminals can be monitored responsive to identification of the SC2 event, and the protective turn-off of the gate voltage is performed when additionally to expiration of the time period the voltage across the power switch main terminals is above approximately 75% (or another value) of the DC-link voltage (e.g., the voltage provided by the power converter).

In another aspect, the SC2 event may be more quickly identified by monitoring the current through the power switch main terminals ($I_{ce}$) and/or the rate of change of the current through the power switch main terminals with respect to time (e.g., $\delta I_{ce}/\delta t$). This allows for detection of the SC2 event when the current through the power switch main terminals ($I_{ce}$) increases (e.g., at the rising edge of the current through the power switch main terminals ($I_{ce}$)). Upon such a detection of the SC2 event, the multi-resistive driving device is controlled to have a first resistor configuration (e.g., a certain combination of resistive elements in the device is activated to provide a first voltage dividing circuit) that lowers the control voltage ($V_{ge}$) to a designated value or lower (e.g., 13 volts or another value). This can prevent overshoot of the control voltage ($V_{ge}$) and/or the current through the power switch main terminals ($I_{ce}$). Additionally, the timer can be started. When the timer reaches a first predefined value and/or dIce/dt decreases below a certain threshold and/or the voltage across the power switch main terminals increased above a certain threshold, a different gate resistor configuration of the multi-resistive driving device is established to increase the control voltage ($V_{ge}$), such as to 14.5 volts or another value. This can prevent an uncontrolled fall back of the current through the power switch main terminals ($I_{ce}$) and an overshoot of the voltage across the power switch main terminals ($V_{ce}$). After the timer reaches a second predefined value, the protective turn-off with controlled control voltage is performed, as described herein. For example, the resistor configuration of the multi-resistive driving device may be modified with respect to time to gradually reduce the control voltage at a designated rate or a rate that is slower than would otherwise occur if a single resistor is switched between a supply voltage lower than the power switch control threshold voltage e.g. −15V and the power switch control electrode.

By providing inventive gate drive units and methods that distinguishing between different short circuit events and then provide a protection scheme or procedure based on the identified short circuit event, stress on a power switch during different short circuit events can be reduced. Reducing this stress can lead to lower failure rates of the power switch. As a result, a reduced converter failure rate in the circuits can be achieved, more converters may be available, the need for fuses in power converters may be reduced or eliminated, and the like.

Another aspect of the inventive gate drive units and methods described herein provide the ability to increase a static on-state gate voltage of the power switch. For example, with the improved short circuit protections described above, the control voltage ($V_{ge}$) that is applied to the control electrode of the power switch can be increased relative to an upper limit on the control voltage that is used without the short circuit protections described above.

FIG. 1 illustrates a circuit diagram of a power supply circuit 100 according to one example of the inventive subject matter described herein. The circuit 100 conductively couples one or more power generators 102 with one or more loads 104 via conductive pathways 106 (e.g., busses, wires, cables, or the like). The power generator 102 can represent an alternator, generator, utility grid, battery, or the like, that generates or supplies electric current or voltage to power the loads 104. In the illustrated example, the loads 104 represent traction motors, but alternatively may represent other systems or devices that consume electric energy (e.g., current and/or voltage) to perform work.

The circuit 100 includes several power switches 108 (e.g., power switches 108A-F) that alternate between states to control conduction of electric energy from the power converter 112 to the loads 104. For example, the power switches 108 can be activated to an active or "on" state that conducts current or voltage between the power generator 102 and the load 104 through the power switches 108, and can be deactivated to a deactivated or "off" state that prevents conduction of the current or voltage between the power converter 112 and the load 104. The switches 108 can control the conduction of current from the power generator 102 to the load 104, and/or from the load 104 to the power generator 102. For example, in one embodiment, current may be conducted from the loads 104 to the generator 102 through one or more of the switches 108. In one aspect, one or more of the power switches 108 are semiconductor power switches, such as IGBTs or other types of switches. Alternatively, the power switches 108 can be another type of switch.

The power switches 108 can alternate between on and off states at different times to control conduction of multiple phases of the current supplied by the power generator 102 to the load 104. In the illustrated example, the power switches 108 are arranged in pairs. For example, the switches 108A, 108B may be one pair, the switches 108C, 108D may be another pair, and the switches 108E, 108F may be another pair. The switches 108 in each pair can alternate such that only one of the switches 108 in the pair is on at a time to control conduction of a phase of the current to the load 104. Alternatively, the switches 108 may be in another arrangement and/or another number of switches 108 may be used.

The switches 108 can be connected with a low inductance bus bar network to a DC-link capacitor 110 that provides electric energy during short time events, such as commutation, short circuits, or the like. If a short circuit event occurs, the inductance of the load 104 is bridged and a low inductive path through the DC-link capacitor 110 is provided. For example, if the power switch 108A, 108C, or 108E fails, then the corresponding power switch 108B, 108D, or 108F in the same pair of switches 108 experiences a short circuit event when the corresponding power switch 108B, 108D, or 108F is turned on. The gate drive unit can protect the corresponding power switch 108B, 108D, or 108F by implementing one or more of the turn off procedures described herein.

The power switches 108 can be controlled and protected from damage or failure due to short circuit events using one or more gate drive units. As described herein, these gate drive units can detect and identify different types of short circuit events and, depending on which type of short circuit event is identified, implement different procedures to protect the power switches 108 from being damaged by the short circuit event.

Figure 2:
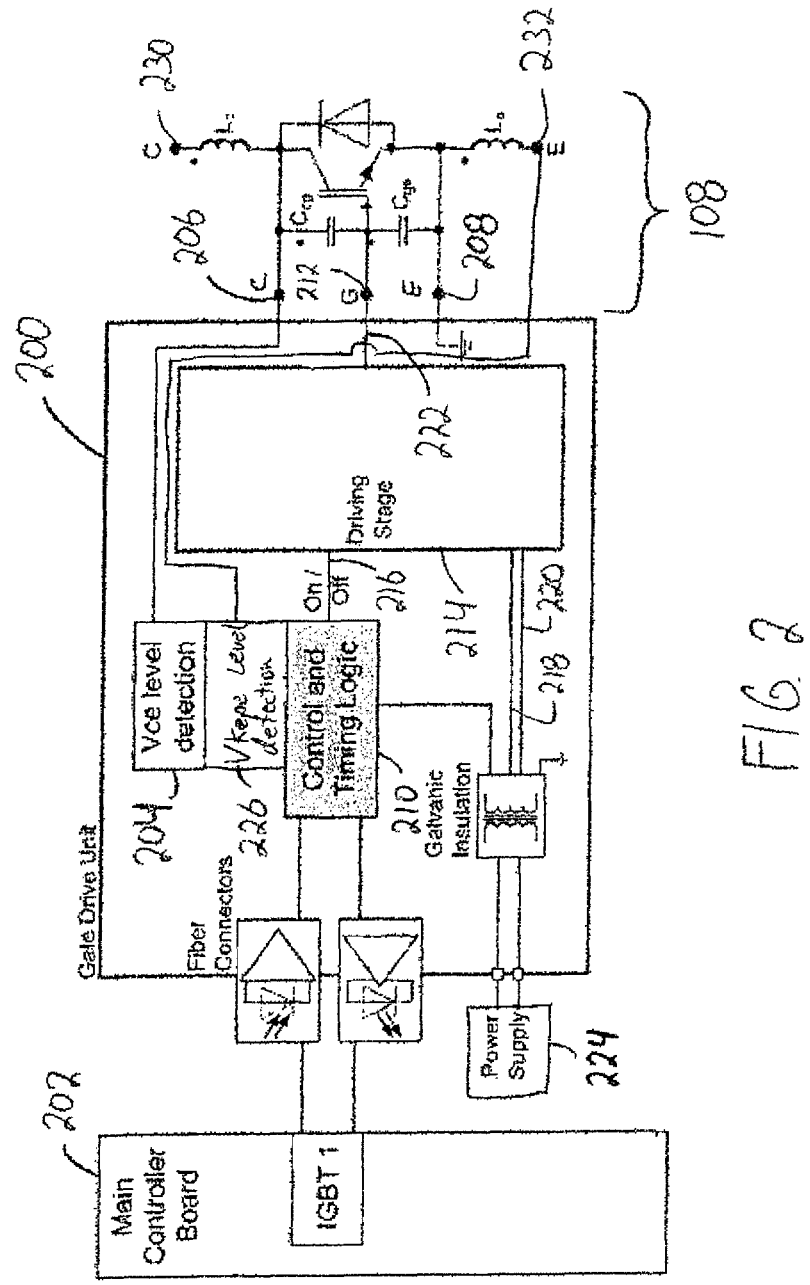
FIG. 2 is a circuit diagram of a gate drive unit or system according to one example of the inventive subject matter described herein.

FIG. 2 is a circuit diagram of a gate drive unit 200 according to one example of the inventive subject matter described herein. The gate drive unit 200 operates to distinguish between different short circuit events involving a power switch 108 and, depending on which event occurs, implements remedial actions to prevent damage or failure of the power switch 108.

The gate drive unit 200 is conductively coupled with a gate driver power supply 224 and the power switch 108. In one embodiment the galvanic insulation converter on the gate drive unit converts the voltage delivered by the gate driver power supply 224 into voltage sources 218 and 220 which can be like +15V and −15V. The voltage sources 218 and 220 represent a source of control voltage that is applied to a control electrode 212 of the power switch 108 to activate the power switch 108. The gate driver power supply 224 can represent a battery or other device that supplies voltage or other electric energy other than the current supplied by the power generator 102.

The gate drive unit 200 can be included in the circuit 100 shown in FIG. 1 by connecting it to the auxiliary terminals of one or more power switches 108. The gate drive unit 200 is connected with a controller board 202 which can activate or deactivate the gate drive unit 200 of each power switch.

The gate drive unit 200 includes hardware circuits or circuitry that includes and/or are connected with one or more components and/or processors (e.g., computer microprocessors). One component of the gate drive unit 200 is a measurement unit 204 ("$V_{ce}$ level detection" in FIG. 2) that measures voltage at the power switch 108. In the illustrated embodiment, the measurement unit 204 senses voltage across auxiliary terminals 206, 208 of the power switch 108 which indicates the voltage across the main terminals 230, 232 of the power switch. The electrical connections 206 and 230 as well as 208 and 232 are electrically similar connections. Between these terminals is a small Inductance in the few nanohenry range which reflects the inductance of the module internal wiring from the main terminals to the transistor chips. Both, the auxiliary terminals as well as the main terminals of the power switch are suitable for identification of the power switch state as described in the subject matter. If the power switch 108 is an IGBT power switch, this voltage can be referred to as a collector voltage or a collector-emitter voltage ($V_{ce}$), such as a voltage drop across a collector terminal 206 and an emitter terminal 208 of the power switch 108. Alternatively, the measurement unit 204 can measure another type of electric quantity and/or measure the quantity at another location. The measurement unit 204 can include or represent one or more hardware circuits or circuitry that measure voltage, current, or another electric quantity, such as the hardware of a voltmeter or the like.

The gate drive unit 200 also includes a processing unit or driving unit 210 ("Control and Timing Logic" in FIG. 2) that controls a rate at which a control voltage ($V_{ge}$) is applied to a control electrode 212 of the power switch 108. This control voltage ($V_{ge}$) is supplied from the voltage sources 218 and 220 and can be controlled to activate or deactivate the switch 108. For example, increasing the control voltage above a designated voltage level can cause the switch 108 to close and conduct current or voltage to the load 104 while decreasing the control voltage below the designated level can cause the switch 108 to open. The processing unit 210 can include hardware circuits or circuitry that include and/or are connected with one or more processors, such as computer microprocessors, field programmable gate arrays (FPGAs), or the like.

The gate drive unit 200 controls the control voltage ($V_{ge}$) by changing configurations or states of a multi-resistive driving device 214 ("Driving Stage" in FIG. 2) of the gate drive unit 200. The multi-resistive driving device 214 includes several resistive elements (e.g., resistors) that can be individually controlled to change the control voltage ($V_{ge}$) supplied to the control electrode 212 of the switch 108. For example, the multi-resistive driving device 214 can receive the control voltage ($V_{ge}$) from the voltage supplies 218 and 220 and can operate as a voltage divider to reduce the control voltage ($V_{ge}$) that is applied to the control electrode 212 of the switch 108. As described below, the processing unit 210 can change the resistive configuration of the multi-resistive driving device 214 over time so that the control voltage ($V_{ge}$) changes over time. The processing unit 210 can operate in this way to control a rate of decrease in the control voltage ($V_{ge}$) to prevent damage to the switch 108 in response to identification of a short circuit event.

Figure 3:
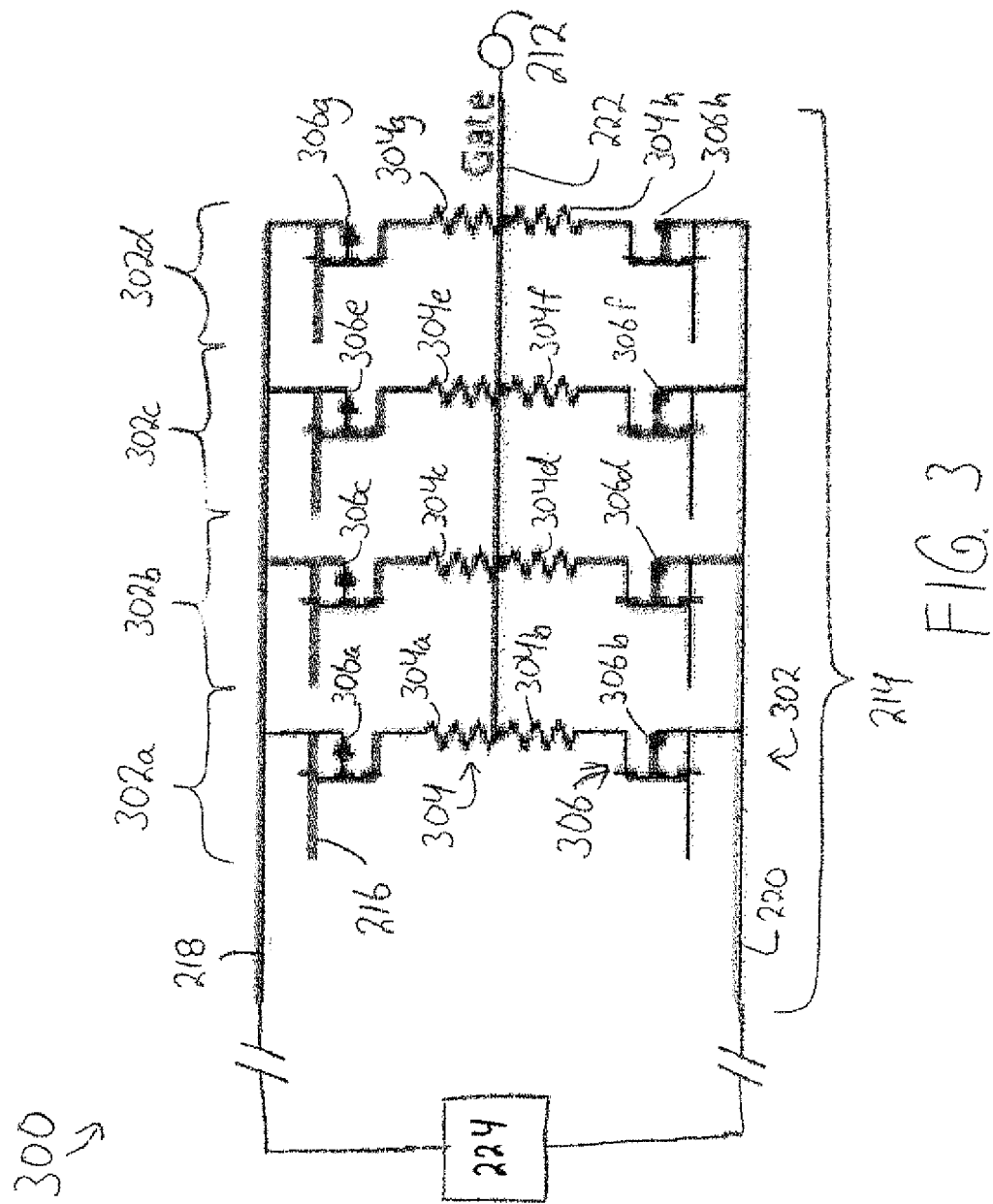
FIG. 3 illustrates a circuit diagram of a multi-resistive driving device shown in FIG. 2 according to one example of the inventive subject matter described herein.

FIG. 3 illustrates a circuit diagram 300 of the multi-resistive driving device 214 according to one example of the inventive subject matter described herein. In the illustrated example, the multi-resistive driving device or stage 214 includes several push-pull output stages 302 (e.g., stages 302a-d) in parallel to each other and conductively coupled with the voltage supplies 218 and 220 and the power switch 108. The stages 300 can be parallel to each other between the voltage supplies 218 and 220 and the control electrode 212 of the power switch 108 inside the gate drive unit 200 (shown in FIG. 2). The multi-resistive driving device 214 includes four parallel stages 302, but optionally may include a larger or smaller number of stages 302.

The switches 306 can include metal-oxide semiconductor field effect transistors (MOSFETs) or other switches controlled by an input signal (e.g., voltage, current, or other signal) received from the processing unit 210 (shown in FIG. 2) along input lines 216 (also shown in FIG. 2). The switches 306 can be individually controllable by the processing unit 210 in that the processing unit 210 can individually activate or deactivate (e.g., turn on or off) individual switches 306 by separately communicating input signals along different ones of the input lines 216. Activating a resistor switch 306 causes at least some of the control voltage received from the voltage sources 218 and 219 to flow through the resistive element 304 connected with the resistor switch 306 downstream of the voltage source 224. Different combinations of the switches 306 can be activated or deactivated to change the total resistance experienced by the control voltage as the control voltage is conducted through the multi-resistive driving device 214. For example, the multi-resistive driving device 214 can operate as a voltage divider, with the switches 306 being individually controlled to change (e.g., reduce) the control voltage ($V_{ge}$) that is output from the multi-resistive driving device 214 on an output line 222 (also shown in FIG. 2) that conducts the reduced control voltage ($V_{ge}$) to the control electrode 212 of the power switch 108.

For example, the stages 302 include plural resistive elements 304 (e.g., resistors) and switches 306. There are two resistive elements 304 and two switches 306 in each stage 302 such that there are eight total resistive elements 304 (e.g., resistive elements 304a-h) and eight total switches 306 (e.g., switches 306a-h) in the illustrated embodiment. Alternatively, there may be another number of resistive elements 304. The switches 306 can be individually controlled to cause or prevent the control voltage from being conducted through the resistive elements 304 from the input lines 218. For example, the processing unit 210 can turn on the resistor switch 306a to cause at least part of the control voltage to be conducted through the resistive element 304a to the control electrode 212 via the line 222, can turn on the resistor switch 306b to cause at least part of the control voltage to be conducted through the resistive element 304b to the control electrode 212 via the line 222, and so on. The processing unit 210 also can turn off the resistor switch 306a to prevent the control voltage to be conducted through the resistive element 304a to the control electrode 212 via the line 222, can turn off the resistor switch 306b to prevent the control voltage to be conducted through the resistive element 304b to the control electrode 212 via the line 222, and so on.

In the illustrated example, with four stages 302 in parallel and each stage including two switches 306 and two resistive elements 304, there are fifteen possible values, excluding the trivial configuration with all switches off, of the total resistance that is turned "off" (e.g., the electrical resistance provided by the resistors 304b,d,f,h through which one of the control voltages is conducted, represented by $R_{goff}$) and the total resistance that is turned "on" (e.g., the electrical resistance provided by the resistors 304a,c,e,g through which one of the control voltages is conducted, represented by $R_{gon}$).

In one aspect, the control voltage ($V_{ge}$) that is conducted out of the multi-resistive driving device 214 to the control electrode 212 of the power switch 108 can be represented by the following relationship:

$$V_{ge} = (V_{on} - V_{off})R_{goff}/(R_{gon} + R_{goff}) + V_{off} \qquad \text{Eqn. 1}$$

where $V_{ge}$ represents the control voltage output to the control electrode, $V_{on}$ represents the positive component of the control voltage received by the device 214 from the gate drive power supply 224 (e.g., +15 volts or another value that is conducted on the line 218), $V_{off}$ represents the negative component of the control voltage received by the device 214 from the gate driver power supply 224 (e.g., –15 volts or another value that is conducted on the line 220), $R_{goff}$ represents the parallel resistance provided by of the resistors 304 b,d,f,h being activated, and $R_{gon}$ represents the parallel resistance provided by the resistors 304a,c,e,g being activated.

In the illustrated example, with four parallel stages 302, there are 225 possible configurations for setting the control voltage ($V_{ge}$) to intermediate levels between the supply voltages 218 and 220, which allows relatively fine adjustment of the control voltage ($V_{ge}$). A configuration of the multi-resistive driving device 214 refers to which resistors 304 are turned on or off. For example, different configurations may have different resistors 304 turned on and different resistors turned off.

Figure 4:
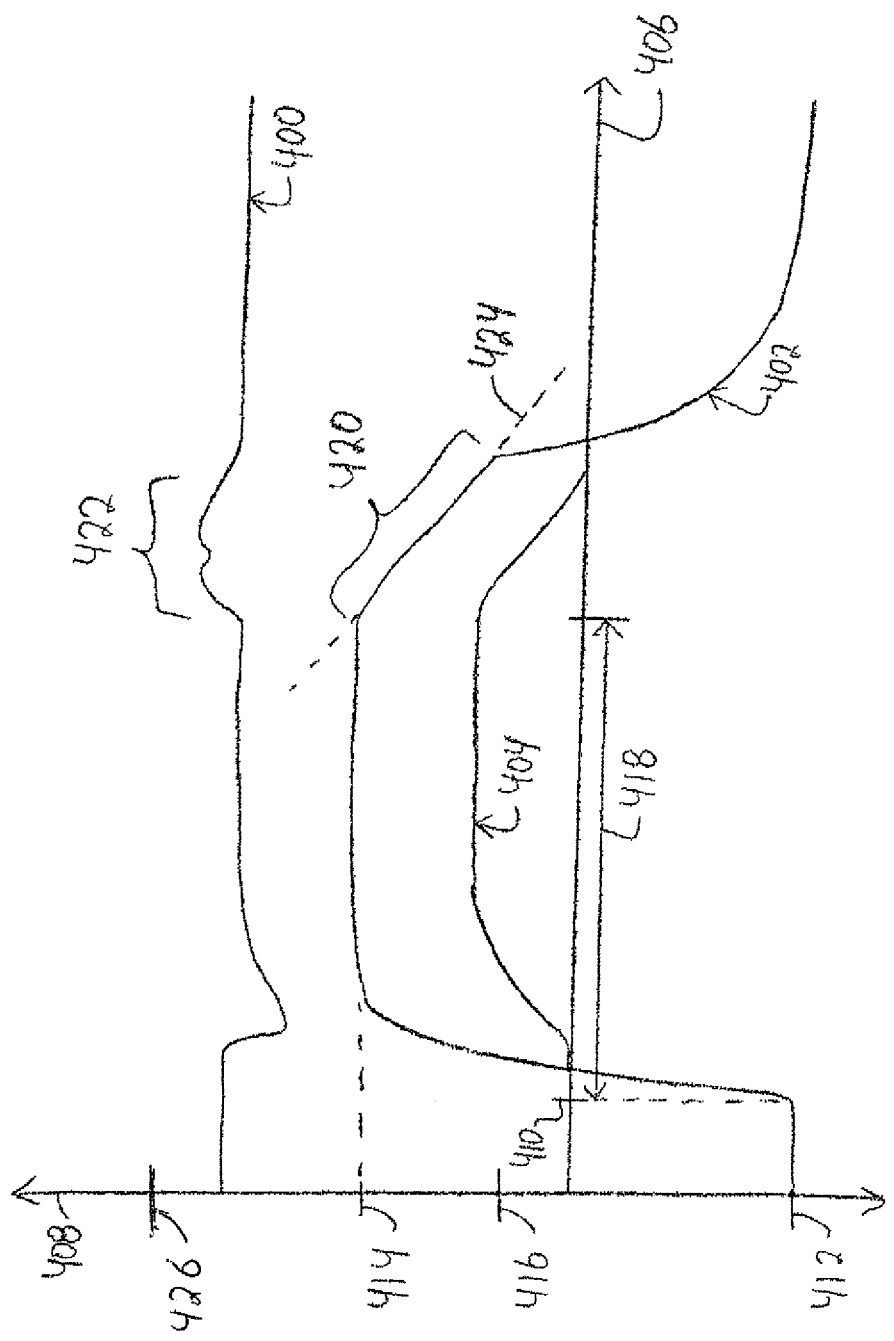
FIG. 4 illustrates voltages of operation of a power switch shown in FIG. 1 and a gate driving unit shown in FIG. 2 according to one example of the inventive subject matter described herein.

FIG. 4 illustrates voltages and currents of operation of a power switch 108 shown in FIG. 1 and the gate driving unit 200 shown in FIG. 2 according to one example of the inventive subject matter described herein. The voltages shown in FIG. 4 demonstrate one example of detecting a first type of short circuit event (SC1) and the responsive procedure implemented by the gate drive unit 200 (shown in FIG. 2) to prevent the SC1 event from damaging the power switch 108 (shown in FIG. 1). The voltages shown in FIG. 4 include the voltage across the power switch main terminals 400, the control voltage ($V_{ge}$) 402, and a short circuit current ($I_{sc}$) 404. The signals 400, 402, 404 are shown alongside a horizontal axis 406 representative of time and a vertical axis 408 representative of magnitudes of the signals. The scale of the vertical axis 408 may be different for different signals. For example, the scale of the vertical axis 408 may be ten times smaller for the short circuit current 404 than for the voltage across the power switch main terminals and the scale of the vertical axis 408 may be 100 times larger for the control voltage 402 than for the voltage across the power switch main terminals 400. As a result, the magnitudes of the short circuit current 404 may be ten times smaller than what is actually shown and the magnitudes of the control voltages 402 may be 100 times larger than what is actually shown relative to the voltage across the power switch main terminals 400.

In operation, the power switch 108 is turned on at an activation time 410 by increasing the control voltage 402 that is output from the device 214 (shown in FIG. 2) from a lower deactivation level 412 (e.g., –15 volts or another voltage) toward an upper activation level 414. The voltage across the power switch main terminals 400 is expected to decrease (e.g., to zero volts or near zero volts) when the power switch 108 is turned on. But, as shown in FIG. 4, the voltage across the power switch main terminals 400 only slightly decreases before increasing to a previous magnitude.

The measurement unit 204 monitors the voltage across the power switch main terminals 400 and reports the voltage across the power switch main terminals 400 to the processing unit 210 (shown in FIG. 2). The processing unit 210 determines if the voltage across the power switch main terminals 400 is at or above a short circuit (SC) detection threshold 416 after expiration of a designated time period 418 that begins at the activation time 410. The time period 418 may be a relatively short time period, such as eight microseconds or another time period. Optionally, the processing unit 210 can determine if the voltage across the power switch main terminals 400 is at or above the SC detection threshold 416 and remains at or above the SC detection threshold 416 during the time period 418. If the voltage across the power switch main terminals 400 is at or above the SC detection threshold 416 following the time period 418, then the processing unit 210 determines that the SC1 event has occurred. Optionally, the measurement unit 204 determines if the voltage across the power switch main terminals 400 indicates that the SC1 event has occurred.

The SC detection threshold 416 and the time period 418 may be based on the type of the power generator 102 and/or the load 104 that is powered by the power generator 102 and/or the type of power switch.

As shown in FIG. 4, the SC1 event causes short circuit currents 404 to increase and, for the switches considered here, reach a substantially constant but high short circuit current level. This can explain why the current 404 has a plateau. These short circuit currents 404 can represent currents flowing through the power switch 108 and can damage the switch 108. When the SC1 event is identified based on the voltage across the power switch main terminals 400, the processing unit 210 can implement a soft turn off procedure to stop the SC1 event (e.g., by eliminating or significantly reducing the short circuit currents 404). In one aspect, this procedure includes reducing the control voltage 402 at a rate that is controlled. For example, cutting off or eliminating the control voltage 402 would result in the control voltage 402 having a vertical or nearly vertical slope or falling edge at or just after the time period 418. This can cause a spike or overshoot in the voltage across the power switch main terminals 400, which could damage the power switch 108.

Instead, in the illustrated example, the processing unit 210 controls the decrease in the control voltage 402 with respect to time such that a slope or reduction rate 424 at which a decreasing portion 420 of the control voltage 402 is decreasing following the time period 418 has a non-zero slope (e.g., the slope is not vertical or nearly vertical). The processing unit 210 can control the slope of the control voltage 402 over the decreasing portion 420 so that the rate 424 at which the control voltage 402 decreases is slower than it would be when the normal turn-off procedure is applied The processing unit 210 can control the reduction in the control voltage 402 by changing which of the resistive elements 304 (shown in FIG. 3) in the multi-resistive driving device 214 (shown in FIG. 2) are on or off (as described above) at different times. For example, at a first time, a first subset of the resistive elements 304 may be on while at a later, second time, a different, second subset of the resistive elements 304 is turned on, and so on. Changing which resistive elements 304 at least partially conduct and divide the input control voltage 402 at different times causes the gate voltage 402 that is output from the device 214 to change with respect to time. The sets of the resistive elements 304 that conduct the control voltage can change over time according to a switching pattern that dictates which resistive elements 304 are on and which are off at different times. An input capacitance of the power switch 108 can act with the resistive elements 304 to operate as a low-pass filter which helps to smooth out discrete steps in the control voltage 402 that is output by the device 214. The switching pattern can change based on the type of load 104 and/or type of the power switch. The switching pattern can be stored in the processing unit 210, such as in a non-volatile memory of the processing unit 210 or in another location.

The control voltage 402 is relatively slowly decreased by changing which resistive elements 304 are on with respect to time. The control voltage 402 is reduced at a rate that is no faster than a designated rate. After a while, the short circuit current 404 is quenched. The control voltage 402 can continue to be slowly decreased until the power switch 108 is fully turned off. Using the many different possible configurations of which resistive elements 304 in the multi-resistive driving device 214 are on or off can allow for increased possibilities (e.g., degrees of freedom) in reducing the control voltage 402. For example, in contrast to a driving unit that does not include multiple parallel stages of resistive elements 304, the driving device 214 has many different arrangements of the resistive elements 304 to allow for relatively small and discrete reductions in the control voltage 402 to be achieved.

In one aspect, the rate 424 at which the control voltage 402 is decreased is slower than the rate at which the control voltage 402 would be decreased if a fewer arrangements of resistive elements 304 were used to reduce the control voltage 402. For example, in contrast to a gate drive unit having only a single set of resistors that are all turned on or off at the same time, the rate 424 at which the control voltage 402 is reduced may be slower than a rate at which the control voltage 402 would be reduced if only one set of resistors were activated. Activating multiple, different sets of resistive elements 304 in the multi-resistive driving device 214 at different times can cause the control voltage 402 to be reduced at a slower rate than simply turning on one static set (e.g., unchanging with respect to time) of resistive elements 304.

As shown in FIG. 4, the reduction in the short circuit current 404 can cause the voltage across the power switch main terminals 400 to increase over a temporally corresponding increasing period 422. This increase in the voltage across the power switch main terminals 400 responsive to initiation of the soft turn off procedure can be referred to as a second overshoot of the voltage across the power switch main terminals 400. The magnitude of the second overshoot in the voltage across the power switch main terminals 400 depends on the rate at which the control voltage 402 is reduced. For example, as the rate at which the control voltage 402 decreases becomes faster (e.g., the slope of the decreasing portion 420 becomes more vertical), the magnitude of the second overshoot in the voltage across the power switch main terminals 400 increases. Conversely, as the rate at which the control voltage 402 decreases becomes slower (e.g., the slope of the decreasing portion 420 becomes more horizontal), the magnitude of the second overshoot in the voltage across the power switch main terminals 400 decreases. The switching pattern of the multi-resistive driving device 214 can be created to ensure that the rate of decrease in the control voltage 402 is sufficiently slow to prevent the magnitude of the second overshoot in the voltage across the power switch main terminals 400 from becoming too large (e.g., exceeding an upper voltage limit 426) and damaging the switch 108, but fast enough to prevent the power switch 108 from staying too long time in the short circuit condition.

The resistive elements 304 can continue to be activated or deactivated in different configurations over time until the control voltage 420 decreases below a threshold (e.g., zero volts), decreases to the lower level 412 where the switch 108 is deactivated, or is decreased at a controlled rate for at least a designated time period. The power switch 108 is then deactivated and the SC1 event is terminated without allowing the short circuit current 404 and/or collector voltage 400 from damaging the power switch 108.

Another type of short circuit event that can be detected by the gate drive unit 200 is the second short circuit event, or SC2. The SC2 event can occur after the power switch 108 is successfully turned on. For example, if the SC1 event is not detected after the power switch 108 is turned on (e.g., the voltage across the power switch main terminals is below the SC detection threshold 416 after the power switch 108 is activated during the time period 418), then the power switch 108 may have been successfully turned on without any short circuit event.

But, another, second type of short circuit event (SC2) can occur after the power switch 108 is successfully activated with electric energy being conducted through the power switch 108. For example, an external short may occur in the load 104, an internal short in a converter leg of the power switch 108, a short in a bus bar of the power switch 108, or the like, can occur after the power switch 108 is activated. This type of short circuit event can be more severe.

In order to detect the SC2 event, the voltage across the power switch main terminals is examined by the measurement unit 204 and/or the processing unit 210 after the time period 418. If the voltage across the power switch main terminals exceeds the SC detection threshold 416 after the time period 418, then the measurement unit 204 and/or processing unit 210 determines that the SC2 event is occurring.

Figure 5:
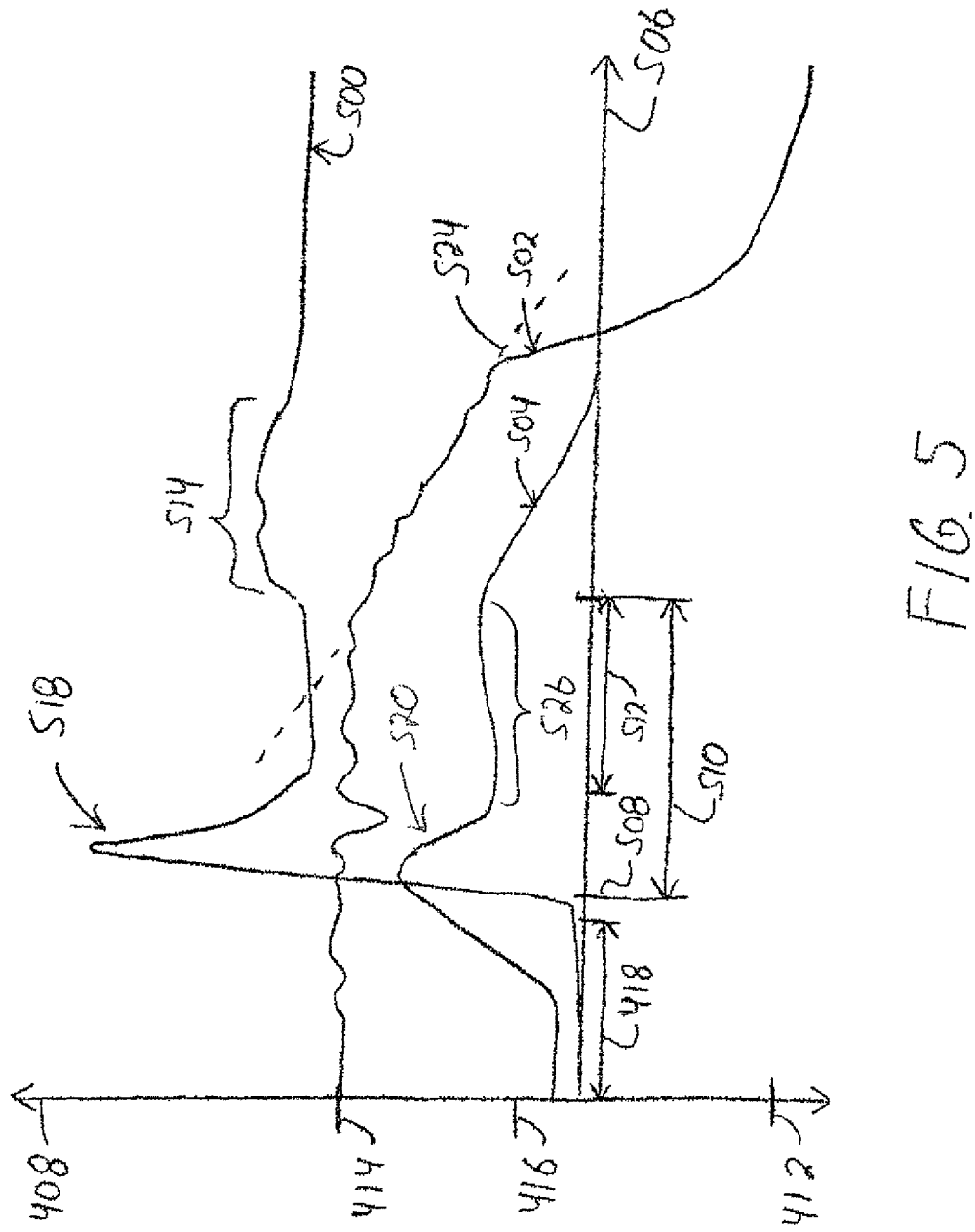
FIG. 5 illustrates voltages and currents of operation of a power switch shown in FIG. 1 and the gate driving unit shown in FIG. 2 according to one example of the inventive subject matter described herein.

FIG. 5 illustrates operation variables of a power switch 108 shown in FIG. 1 and the gate driving unit 200 shown in FIG. 2 according to one example of the inventive subject matter described herein. The voltages shown in FIG. 5 demonstrate detection of the second type of short circuit event (SC2) and one example of a responsive procedure that may be implemented by the gate drive unit 200 (shown in FIG. 2) responsive to identifying the SC2 event to prevent damage to the power switch 108.

The voltages shown in FIG. 5 include the voltage across the power switch main terminals 500, the control voltage ($V_{ge}$) 502, and the current through the device that experiences the short, Ice 504. These signals 500, 502, 504 may be representative of the similarly named signals 400, 402, 404 shown in the illustration of the SC1 event in FIG. 4. The signals 500, 502, 504 are shown alongside a horizontal axis 506 representative of time and the vertical axis 408 representative of magnitudes of the voltages. As described above in connection with FIG. 4, the scale of the vertical axis 408 may be different for the different signals 500, 502, 504.

In the illustrated example of FIG. 5, the collector voltage 500 remains below the SC detection threshold 416 while the power switch 108 conducts electric energy between the power generator 102 and the load 104. The voltage across the power switch main terminals 500 is less than this SC detection threshold 416 for at least the time period 418. Then, after expiration of the time period 418, the voltage across the power switch main terminals 500 increases above the SC detection threshold 416 while the device is on.

When the voltage across the power switch main terminals 500 increases, this voltage can cause electric current to be fed into the control electrode 212 (shown in FIG. 2) of the power switch 108 due to the Miller effect, which can then cause the control voltage 502 at the power switch 108 to increase above the voltage supplied by the voltage supply 218. This can cause the current that is conducted into the collector terminal 230 (e.g., the collector current $I_{ce}$) to increase and potentially damage the power switch 108, such as is shown by a current spike 520 in FIG. 5. Once the voltage across the power switch main terminals 500 increases to the DC-link voltage that is provided by the power generator 102 and the DC-link capacitor, then the current through the power switch main terminals ($I_{ce}$) will fall back (e.g., reduce) to a lower short circuit current level 526 through the power switch 108. This, uncontrolled fall back, can cause the voltage across the power switch main terminals 500 to significantly increase above the DC-link voltage, which can damage or destroy the power switch 108.

In order to prevent this damage or destruction, the procedure used by the gate drive unit 200 to eliminate the short circuit current 504 being conducted through the power switch 108 can involve delaying when the short circuit current 504 is reduced or eliminated until after this short circuit current 504 reaches a steady state (e.g., is not increasing or decreasing at a rate that is faster than a designated rate).

This procedure can involve the measurement unit 204 and/or the processing unit 210 monitoring the voltage across the power switch main terminals 500 and determining when the voltage across the power switch main terminals 500 increases above the SC detection threshold 416 (e.g., at a short circuit detection time 508). The processing unit 210 may then begin a delay timer or otherwise track passage of time following the detection time 508. After a designated delay time period 510 following the detection time 508, the processing unit 210 can begin controlling the multi-resistive driving device 214 to relatively slowly reduce the control voltage 502 at a controlled rate. In one embodiment, the delay time period 510 can be four microseconds, but another time period can be used depending on the power switch 108, power generator 102, and/or load 104 being used.

The processing unit 210 can reduce the control voltage 502 at a controlled reduction rate 524 that is the same as or different from the rate 424 (shown in FIG. 4) at which the control voltage 402 (shown in FIG. 4) is reduced in response to detection of the SC1 event. As described above, the processing unit 210 can reduce the control voltage 502 at a controlled rate by changing which resistive elements 304 (shown in FIG. 3) are activated or deactivated to conduct or not conduct the control voltage 502 at different times. As shown in FIG. 5, the control voltage 502 is decreased at a relatively slow rate (e.g., slower than just turning off the control voltage 502). The control voltage 502 can continue to be decreased until the power switch 108 is turned off (e.g., the control voltage 502 reaches zero or decreases to the lower level 412). Gradual reduction of the control voltage 502 causes the short circuit current 504 to decrease at approximately the same or the same rate as the control voltage 502 until the short circuit current 504 is quenched.

Delaying the start of reducing the control voltage 502 can ensure that the protective turn-off of the control voltage 502 (e.g., at the controlled rate) is performed when the short circuit current 504 is in steady state. For example, as shown in FIG. 5, the short circuit current 504 reaches a steady state over a steady state time period 512 when the short circuit current 504 is not changing by more than a designated amount and/or changes in the short circuit current 504 occur at a relatively slow rate (e.g., slower than a designated rate). Once the short circuit current 504 reaches such a steady state, the control voltage 502 can be slowly reduced in order to avoid the voltage across the power switch main terminals 500 increasing too much and damaging or destroying the power switch 108. As shown in FIG. 5, the voltage across the power switch main terminals 500 may slightly increase upon initiation of the protective turn off procedure of the control voltage 502 (e.g., represented by increasing portion 514), but this increase may be considerably less than if the control voltage 502 were reduced at a faster rate, abruptly turned off, and/or reduced before the short circuit current 504 reaches a steady state.

Optionally, the protective turn off procedure of the control voltage 502 can be initiated based on the magnitude of the voltage across the power switch main terminals 500. For example, the measurement unit 204 and/or processing unit 210 can monitor the voltage across the power switch main terminals 500 to determine when the voltage across the power switch main terminals 500 reaches or exceeds a designated fraction or percentage of the DC-link voltage (e.g., the voltage generated or output by the power generator 102). In one aspect, this fraction or percentage may be 75% or another fraction or percentage. Once the voltage across the power switch main terminals 500 reaches this fraction or percentage of the DC-link voltage, the control voltage 502 is reduced at a controlled rate 524, as described above.

In one embodiment, the control voltage 502 may be reduced at the controlled rate responsive to the voltage across the power switch main terminals 500 reaching or exceeding the designated fraction or percentage of the DC-link voltage, regardless of how long this occurs after the detection time 508. For example, the processing unit 210 may not wait for expiration of the delay time period 510 before starting to reduce the control voltage 502. Alternatively, the processing unit 210 may not initiate the controlled reduction in the control voltage 502 until both the delay time period 510 has expired and the voltage across the power switch main terminals 500 reaches or exceeds the designated fraction or percentage of the DC-link voltage.

In addition to or as an alternate to monitoring the voltage across the power switch main terminals 500 to identify the SC2 event and/or determine when to initiate the protective turn off of the control voltage 502, the measurement unit 204 and/or processing unit 210 can monitor the current through the power switch main terminals ($I_{ce}$) and/or rate of change in the current through the power switch main terminals ($\delta I_{ce}/\delta t$). The current through the power switch main terminals ($I_{ce}$) can include the electric current conducted to the collector terminal 230 of the power switch 108, as described above. The measuring unit 204 can sense the current through the power switch main terminals ($I_{ce}$) and the processing unit 210 can determine when the current through the power switch main terminals ($I_{ce}$) exceeds a designated current detection threshold and/or when the rate of change in the current through the power switch main terminals is faster than a designated detection rate. The increase of the current through the power switch main terminals ($I_{ce}$) and/or the rate of change in the current through the power switch main terminals can indicate that the voltage across the power switch main terminals 500 is rapidly increasing due to the SC2 event.

Another measurement unit 226 ("$V_{kepe}$ level detection" in FIG. 2) can sense the current through the power switch main terminals ($I_{ce}$) and/or the rate of change of the current through the power switch main terminals with respect to time (e.g., $\delta I_{ce}/\delta t$). The measurement unit 226 can include hardware circuits or circuitry that includes and/or are connected with one or more components and/or processors (e.g., computer microprocessors). In the illustrated embodiment, the measurement unit 226 senses voltage between the kelvin (or auxiliary) emitter and the power emitter (or main emitter terminal) connection (e.g., 232 in FIG. 2). There may be a stray inductance between these connections through which the main current through the power switch is flowing.

Upon detection of the current through the power switch main terminals ($I_{ce}$) increasing above the current detection threshold and/or the rate of change in the current through the power switch main terminals ($I_{ce}$) being faster than a designated rate, the processing unit 210 can activate a first designated set of the resistive elements 304 in the multi-resistive driving device 214. This causes the control voltage 502 to be reduced to a designated first voltage, such as to 13 volts or another value. The control voltage 502 may be reduced to this designated voltage relatively quickly so that the control voltage 502 and/or current through the power switch main terminals ($I_{ce}$) do not increase or overshoot too much and cause damage to the power switch 108. The processing unit 210 can initiate a timer upon reducing the control voltage 502 to the designated voltage and, when a designated delay time period is reached, the processing unit 210 can then activate a different, second designated set of the resistive elements 304 in the multi-resistive driving device 214. This designated delay time period may be different from or the same as the time period 510.

The resistive elements 304 in the second set are activated to increase the control voltage 502 to a designated second voltage, such as 14.5 volts or another value. The reduction and then increase in the control voltage 502 can prevent an uncontrolled fall back or reduction of the current through the power switch main terminals ($I_{ce}$), which assists in preventing the voltage across the power switch main terminals 500 from overshooting or increasing sufficiently far to cause damage to the power switch 108.

The processing unit 210 may then wait a second designated delay time period following the designated increase in the control voltage 502. This second delay time period may be the same or different than the delay time period 510. After this second delay time period, the processing unit 210 can then implement the protective turn off procedure described above. For example, the processing unit 210 can change which resistive devices 304 in the multi-resistive driving device 210 are conducting the control voltage at different times in order to gradually decrease the control voltage 502 at the controlled rate 524. The control voltage 502 may continue to be decreased until the power switch 108 is deactivated. As shown in FIG. 5, this control of the control voltage 502 can extinguish the short circuit current 504 while avoiding a significant overshoot of the voltage across the power switch main terminals 500 that could damage or destroy the power switch 108.

Returning to the description of the gate drive unit 200 shown in FIG. 2, in another aspect of the inventive subject matter described herein, the control voltage ($V_{ge}$) applied to the power switch 108 to activate the power switch 108 can be increased. The saturation voltage ($V_{ceSat}$) of a power switch 108 such as an IGBT can depend on the control voltage ($V_{ge}$) applied to the power switch 108. For some power switches 108, a control voltage ($V_{ge}$) of 15 volts (or another value) can be used for turning on the power switch 108. But, some power switches 108 have larger limits on the control voltages ($V_{ge}$) that can be applied to the power switches 108, such as 20 volts (or another value). Increasing the control voltage ($V_{ge}$) for a power switch 108 can reduce the losses of the voltage or current being conducted through the power switch 108, but also can increase the stress on the power switch 108 during a short circuit event due to increased short circuit current caused by the increased control voltage ($V_{ge}$). For example, at relatively large currents, the conduction losses caused by conduction of the voltage or current through the power switch 108 can be reduced by approximately 10% (or another amount) when the control voltage ($V_{ge}$) is increased, such as by increasing the control voltage ($V_{ge}$) by 33% or another value (e.g., from 15 volts to 20 volts).

Figure 6:
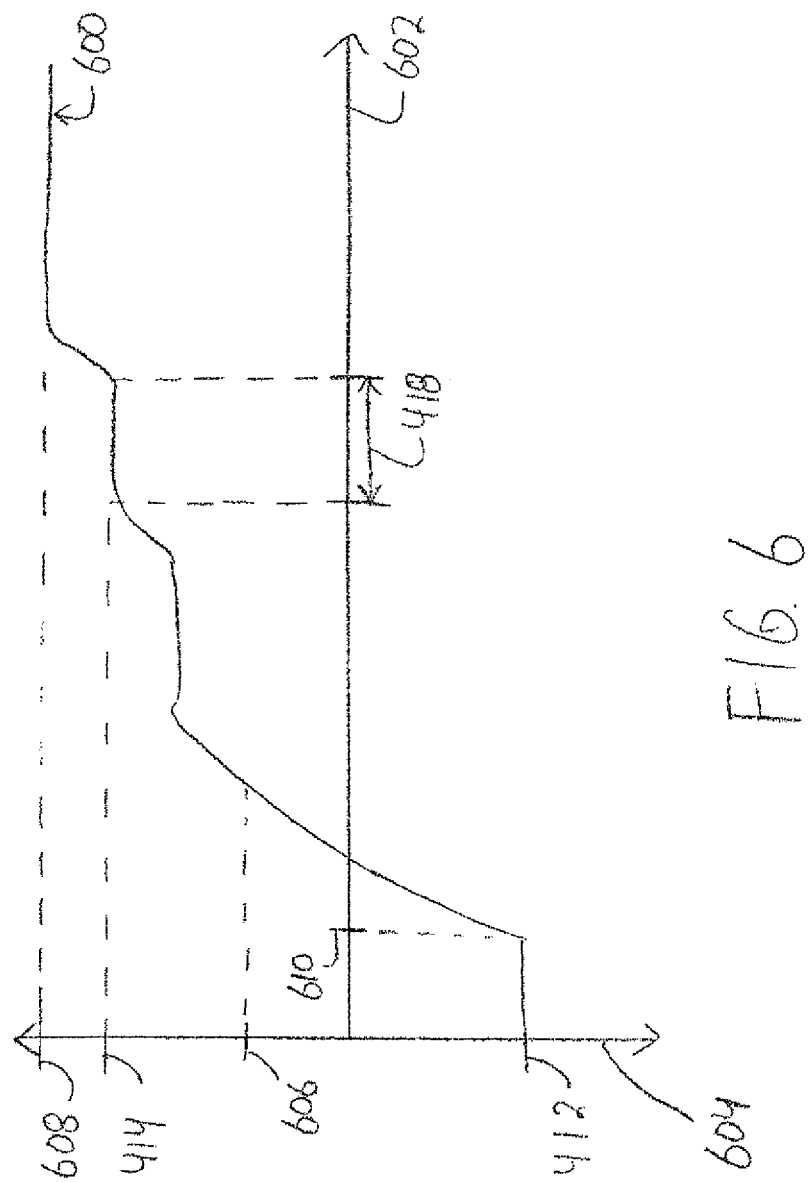
FIG. 6 illustrates gate voltages applied to a gate terminal shown in FIG. 2 of the power switch shown in FIG. 1 according to one example of the inventive subject matter described herein.

In order to safely increase the control voltage ($V_{ge}$), the gate drive unit 200 can controllably increase the control voltage ($V_{ge}$) during activation of the power switch 108 using the multi-resistive driving device 214. FIG. 6 illustrates control voltages 600 applied to the control electrode 212 (shown in FIG. 2) of the power switch 108 (shown in FIG. 1) according to one example of the inventive subject matter described herein. The control voltages 600 are shown alongside a horizontal axis 602 representative of time and a vertical axis 604 representative of magnitudes of the control voltage 600.

Prior to turning on the power switch 108, the control voltage 600 is at the lower level 412 described above representing the supply voltage 220. When the power switch 108 is turned on at an activation time 610, the processing unit 210 changes which resistive elements 304 (shown in FIG. 3) of the multi-resistive driving device 214 are turned on or off at different times in order to control the rate at which the control voltage ($V_{ge}$) is increasing. Different resistive elements 304 are turned on or off with respect to time until the control voltage ($V_{ge}$) reaches a designated threshold voltage ($V_{th}$) 606 of the power switch 108. The processing unit 210 can continue changing which resistive elements 304 are conducting the control voltage ($V_{ge}$) until the control voltage ($V_{ge}$) reaches the upper level 414 (e.g., the voltage that activates or turns on the power switch 108, such as 15 volts or another value).

The processing unit 210 may then stop changing the resistive elements 304 that are activated in order to keep the control voltage ($V_{ge}$) at or near the upper level 414. As described above, the processing unit 210 can wait for the designated time period 418 to determine if a short circuit event (e.g., SC1 event) is detected. If no short circuit event is detected during the time period 418, then the processing unit 210 may change which resistive elements 304 are activated or deactivated to increase the control voltage ($V_{ge}$) again to an upper threshold 608 (e.g., 20 volts or another value) representing the other supply voltage 218. As a result, the control drive unit 200 is able to increase the control voltage ($V_{ge}$) to larger magnitudes to reduce losses in the power switch 108 while providing increased protection against short circuit events, as described above.

As described above, the multi-resistive driving device 214 can be used to control the control voltage ($V_{ge}$) and/or the rate at which the control voltage ($V_{ge}$) changes. Alternatively, one or more other devices may be used to control the control voltage ($V_{ge}$) and/or the rate at which the control voltage ($V_{ge}$) changes. As one example, a gate driver described in Petar J. Grbovic, "An IGBT Gate Driver For Feed-Forward Control Of Turn-On Losses And Reverse Recovery Current," IEEE Transactions On Power Electronics, Vol. 23, No. 2, March 2008, could be used. The gate driver in Grbovic generates a voltage reference is generated that is fed into a boosting stage. The boosting stage outputs a voltage that follows (e.g., changes in the same or similar manner as) the reference voltage, and can provide the current for charging input capacitance of a power switch 108 such as an IGBT. The voltage reference could be generated with a digital-to-analog converter (DAC) that is controlled by a processing device, such as the processing unit 210 or another device. The gate voltage and rate of change in the gate voltage could then be controlled by the processing unit 210 controlling the voltage reference. For example, the processing unit 210 could change the voltage reference as a controlled rate to cause the control voltage that is output by the driving stage to also change at the controlled rate.

Alternatively, the control voltage can be controlled by the gate driving unit 200 charging an input capacitance of the power switch with a constant or approximately constant current. This could cause the control voltage to change at a controlled rate (e.g., have a constant or approximately constant slew rate). As one example of implementing such control over the control voltage, a large inductor could be charged with electric energy and then discharged to the control electrode 212 of the power switch 108. As one example, the inductor described in U.S. Patent Application Publication No. 2010/019807 could be used.

In another aspect of the gate drive units described and shown herein, the processing unit of the gate drive unit can controllably decrease the rate at which the control voltage is decreased based on the DC-link voltage of the converter. For example, as the DC-link voltage of the converter increases, the processing unit may decrease the rate at which the control voltage is decreased (e.g., the control voltage may decrease slower) while, as the DC-link voltage of the converter decreases, the processing unit may increase the rate at which the control voltage is decreased (e.g., the control voltage may decrease faster). The control voltage may be decreased at slower rates for larger supply voltages in order to prevent large overshoot of the current applied across the main terminals of the power switch. In one example, the processing unit can increase the rate at which the control voltage is decreased responsive to the first voltage across the main terminals of the power switch being less than a designated magnitude, and can decrease the rate at which the control voltage is increased responsive to the first voltage across the main terminals of the power switch being at least as large as the designated magnitude.

The processing unit can control the rate of decrease in the control voltage by changing which sets of resistive elements in the multi-resistive driving device are activated or deactivated at one or more different times. For example, a first set of the resistive elements may be activated and a different, second set of the resistive elements may be deactivated during a first time period. A different, third set of the resistive elements may be activated and a different, fourth set of the resistive elements may be deactivated during a subsequent second time period, and so on. The resistive elements included in one or more of these sets may be changed by the processing unit based on the supply voltage. For example, different sets of the resistive elements may be designated for different ranges of the supply voltage. Depending on which of these ranges that the supply voltage falls into, the processing unit can change which resistive elements are included in the first, second, third, fourth, and so on, sets.

Optionally, the processing unit can control the rate of decrease in the control voltage by changing the time periods during which different sets of resistive elements in the multi-resistive driving device are activated or deactivated. For example, the first time period that the first set of resistive elements is activated and the second set of resistive elements is deactivated, the second time period that the third set of resistive elements is activated and the fourth set of resistive elements is deactivated, and so on, may change based on changes in the supply voltage.

Figure 7:
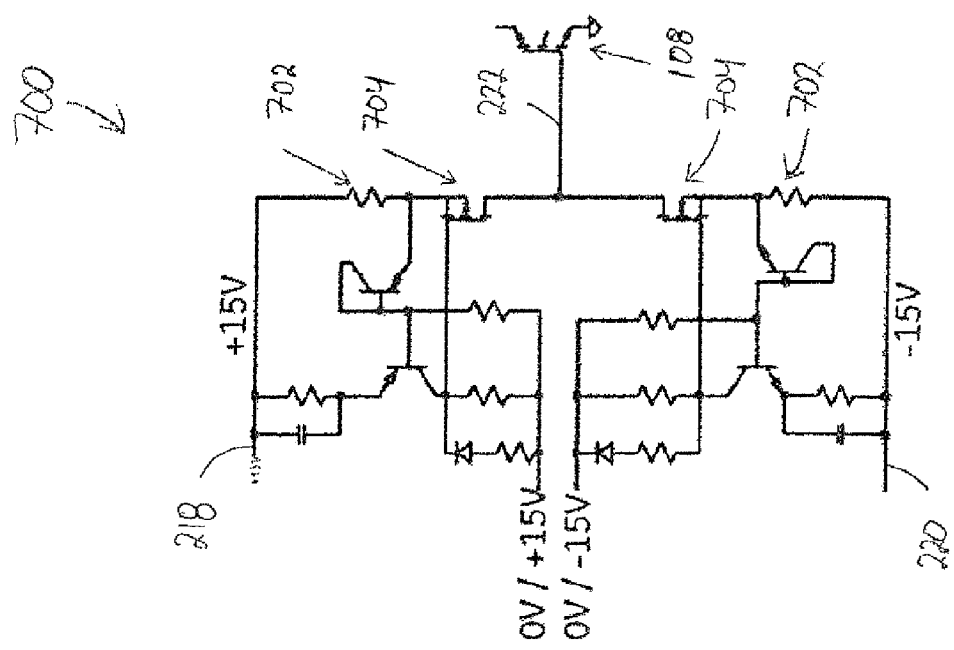
FIG. 7 illustrates another embodiment of a multi-current source device that can be included in the gate drive unit shown in FIG. 2.

FIG. 7 illustrates another embodiment of a multi-current source device 700 that can be included in the gate drive unit 200 shown in FIG. 2. The device 700 receives the control voltage from the gate drive power supply 224 over the lines 218, 220. Although the control voltage received from the lines 218, 220 is shown as +/−15 volts, another voltage can be provided. The device 700 includes resistive elements 702 and switches 704 which may be similar or identical to the resistive elements 304 and switches 306, respectively, shown in FIG. 3.

In contrast to the multi-resistive driving device 214 shown in FIG. 3, the locations of the resistive elements and switches are switched in the device 700 shown in FIG. 7. For example, the control voltage from the voltage supplies 218 and 220 is conducted through the resistive elements 702 prior to being conducted through the switches 704. In these locations, the resistive elements 702 act as shunt resistors that provide negative feedback to the control voltage of the switches 704. The switches 704 can work in the active region and act like a variable resistor. When the power switch 108 is activated, the switches 704 have relatively large resistances that decrease over time. These resistances can decrease until gate terminals of the switches 704 are charged (e.g., receive a gate voltage of 15 volts or another value). As a result, the switches 704 gradually increase the control voltage that is output through the switches 704 to the control electrode 212 of the power switch 108 via the line 222. Conversely, the control voltage can be reduced to cause the resistances of the switches 704 to increase over time and, as a result, gradually decrease the control voltage that is output to the control electrode 212 of the power switch 108. In one aspect, the resistance needed for charging the gate terminal of the switches 704 can be defined by the magnitude of the resistance provided by the resistive elements 702 and/or the on resistance ($R_{dson}$) of the switches 704.

Figure 8:
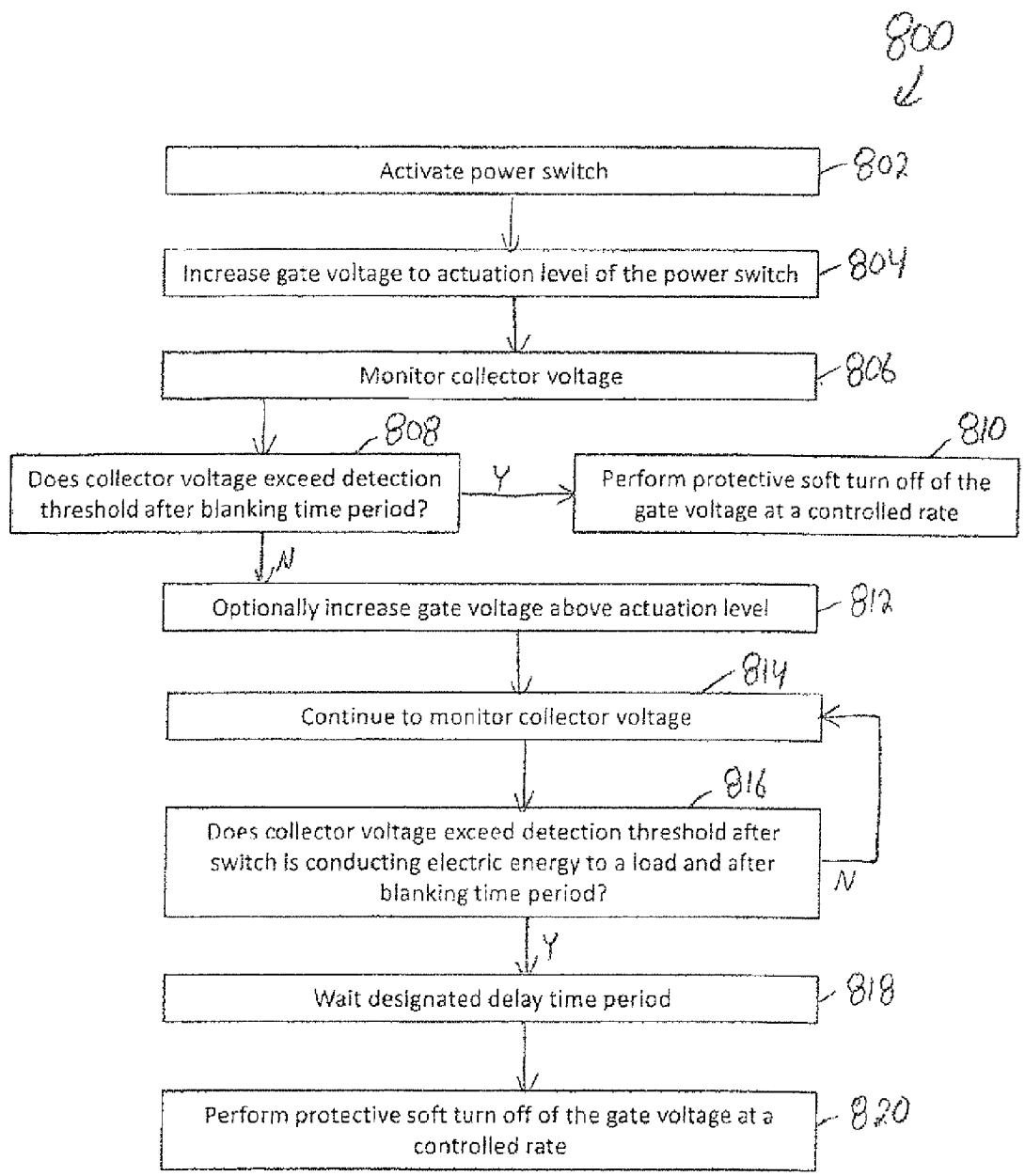
FIG. 8 illustrates a flowchart of a method for providing short circuit protection for a power switch according to one example of the inventive subject matter described herein.

FIG. 8 illustrates a flowchart of a method 800 for providing short circuit protection for a power switch according to one example of the inventive subject matter described herein. The method 800 may be implemented using one or more embodiments of the gate drive unit 200 shown in FIG. 2.

At 802, a power switch is activated. The power switch may be activated by initiating a process to close the power switch so that the power switch begins to conduct electric energy from a power supply to a load. In one example, activation of a power switch begins by increasing a control voltage applied to a control electrode of the power switch.

At 804, the control voltage is increased to an actuation level of the power switch. For example, the control voltage can be increased (e.g., at a controlled or delayed rate) to a magnitude at which the power switch closes and begins to conduct electric energy from the power supply to the load.

At 806, the voltage across the main terminals of the power switch is monitored. For example, the voltage applied to the main terminals of the power switch may be measured periodically or otherwise. At 808, the voltage across the main terminals of the power switch is examined to determine if the voltage across the main terminals of the power switch exceeds a short circuit detection threshold. In one aspect, the voltage across the main terminals of the power switch measured after a designated time period following activation of the power switch is examined to determine if the voltage across the main terminals of the power switch exceeds the detection threshold. If the supply voltage exceeds the detection threshold, this may indicate occurrence of a first type of short circuit event (SC1). As a result, flow of the method 800 can continue to 810. If the voltage across the main terminals of the power switch does not exceed the detection threshold, then the voltage across the main terminals of the power switch may indicate that the power switch has been successfully closed or activated to conduct electric energy from the power supply to the load without the SC1 event occurring. As a result, flow of the method 800 can continue to 812 or 814.

At 810, a protective soft turn off of the control voltage at a controlled rate is performed. As described above, the control voltage can be decreased at a rate that is slower than simply cutting off supply of the control voltage. The rate at which the control voltage is decreased can be controlled by modulating with respect to time which of several resistive elements is activated to conduct the control voltage through a multi-resistive driving device and divide or otherwise reduce the control voltage. Optionally, other techniques may be used to control the decrease in the control voltage, as described herein. The control voltage may continue to be decreased until the power switch is opened or deactivated and is no longer conducting electric energy from the power supply to the load.

At 812, the control voltage may optionally be increased above the activation level of the power switch. As described above, once the power switch is closed and is conducting electric current without detection of the SC1 event, the control voltage may be increased even further to reduce conduction losses of the power switch.

At 814, the voltage across the main terminals of the power switch of the power switch continues to be monitored. For example, the voltage across the main terminals of the power switch may be measured periodically or otherwise while the power switch is closed to conduct current from the power supply to the load.

At 816, the voltage across the main terminals of the power switch is examined to determine if the voltage across the main terminals of the power switch exceeds the short circuit detection threshold voltage while the power switch is closed to current. If the voltage across the main terminals of the power switch does exceed a threshold (such as the detection threshold or another threshold), then the second type of short circuit event (SC2) is identified as occurring. As a result, flow of the method 800 can proceed to 818. On the other hand, if the collector voltage does not exceed the detection threshold, then no SC2 event is identified and the method 800 can return to 814 for continued monitoring and examination of the voltage across the main terminals of the power switch.

At 818, a protective soft turn off procedure of the control voltage is delayed for at least a designated delay time period. As described above, the procedure can be modified to ensure that the short circuit current or voltage has reached steady state. At 820, the protective soft turn off of the control voltage is performed after the delay. The control voltage can be decreased at a rate that is slower than simple turn off methods. The rate at which the control voltage is decreased can be controlled by modulating with respect to time which of several resistive elements is activated to conduct the control voltage through a multi-resistive driving device and divide or otherwise reduce the control voltage. Optionally, other techniques may be used to control the decrease in the control voltage, as described herein. The control voltage may continue to be decreased until the power switch is opened or deactivated and is no longer conducting current.

In one example of the inventive subject matter described herein, a gate drive unit for operation of a converter is provided. The gate drive unit includes a measurement unit, a multi-resistive driving device, and a processing unit. The measurement unit is configured to measure a first voltage across main terminals of a power switch. The multi-resistive driving device is conductively coupled with an electrically insulated control electrode of the power switch. The multi-resistive driving device includes plural individually controllable resistive elements conductively coupled between a voltage source and the control electrode of the power switch. The processing unit is configured to control the voltage that is applied to the control electrode of the power switch by the voltage source to activate the power switch. The processing unit also is configured to individually activate or deactivate the resistive elements of the multi-resistive driving device to change which of the resistive elements at least partially conduct the control voltage from the voltage source to the control electrode of the power switch at different times responsive to the first voltage across the main terminals of the power switch representing a first type of short circuit event. The processing unit also is configured to change which of the resistive elements are activated or deactivated to control a rate at which the control voltage decreases during deactivation of the power switch responsive to a first type of a short circuit event occurring.

In one aspect, the multi-resistive driving device includes the resistive elements connected with each other in plural parallel stages between the voltage source and the control electrode of the power switch. The multi-resistive driving device also can include plural switches coupled with the resistive elements. The processing unit can be configured to individually activate or deactivate the switches to conduct or prevent conduction, respectively, of the control voltage through the resistive elements to the control electrode of the power switch to divide and reduce the control voltage.

In one aspect, the processing unit is configured to change which of the switches are activated at different times to divide and reduce the control voltage applied to the control electrode of the power switch by different amounts at the different times.

In one aspect, the processing unit is configured to begin individually activating or deactivating the resistive elements to control the rate at which the control voltage applied to the control electrode of the power switch decreases when the first voltage across the power switch main terminals exceeds a short circuit detection threshold after expiration of a designated time period following activation of the power switch.

In one aspect, the processing unit also is configured to begin individually activating or deactivating the resistive elements to control the rate at which the control voltage applied to the control electrode of the power switch is decreased responsive to the first voltage across the main terminals of the power switch representing a different, second type of short circuit event. The first voltage across the main terminals of the power switch represents the second type of short circuit event when the control voltage across the main terminals of the power switch decreases below a short circuit detection threshold when the power switch is closed and then increases above the short circuit detection threshold while the control voltage at the control electrode of the power switch is still configured to close the power switch.

In one aspect, responsive to the first voltage across the main terminals of the power switch representing the second type of short circuit event, the processing unit is configured to decrease the control voltage applied to the control electrode of the power switch by waiting for a designated delay time period and, upon expiration of the delay time period, controlling the rate at which the control voltage decreases by individually activating or deactivating the resistive elements of the multi-resistive driving device.

In one aspect, the processing unit is configured to control the multi-resistive driving device to increase the control voltage applied to the control electrode of the power switch to an initial activation level. The processing unit also can be configured to increase the control voltage above the initial activation level responsive to the first voltage across the main terminals of the power switch not representing the first type of short circuit event after the designated time period.

In another example of the inventive subject matter described herein, a method for providing short circuit protection includes monitoring a rate of change in current conducted through main terminals of a power switch, determining when the rate of change in the current is faster than a designated detection rate, and responsive to the rate of change in the current exceeding the designated detection rate, changing which of plural individually controllable resistive elements in a multi-resistive driving device are active to at least partially conduct a control voltage supplied to a control electrode of the power switch at different times. Changing which of the resistive elements are active at different times controls a rate at which the control voltage supplied to the control electrode of the power switch decreases.

In one aspect, the rate of change in the current across the main terminals of the power switch exceeds the designated detection rate responsive to a second type of short circuit event occurring.

In one aspect, changing which of the resistive elements are active at different times includes dividing the control voltage by different sets of the resistive elements at the different times.

In another example of the inventive subject matter described herein, a gate drive unit includes a measurement unit, a multi-resistive driving device having plural individually controllable resistive elements, and a processing unit. The measurement unit is configured to monitor a rate of change in current conducted across main terminals of a power switch. The processing unit is configured to determine when the rate of change in the current is faster than a designated detection rate. The processing unit also is configured to, responsive to the rate of change in the current exceeding the designated detection rate, change which of the resistive elements in the multi-resistive driving device are active to at least partially conduct a control voltage supplied to a control electrode of the power switch at different times. The processing unit can change which of the resistive elements are active at different times to control a rate at which the control voltage supplied to the control electrode of the power switch decreases.

In one aspect, the rate of change in the current across the main terminals of the power switch exceeds the designated detection rate responsive to a second type of short circuit event occurring.

In one aspect, the processing unit is configured to change which of the resistive elements are active at different times in order to divide the control voltage by different sets of the resistive elements at the different times.

In another example of the inventive subject matter, a method (e.g., for providing short circuit protection) includes measuring a first voltage across main terminals of a power switch and, responsive to the first voltage across the main terminals of the power switch representing a first type of short circuit event, individually activating or deactivating resistive elements of a multi-resistive driving device coupled between a voltage source and a control electrode of the power switch. The resistive elements are individually activated or deactivated to change which of the resistive elements at least partially conduct a control voltage from the voltage source to the control electrode of the power switch at different times. Individually activating or deactivating the resistive elements decreases the control voltage at a controlled rate.

In another example of the inventive subject matter, a method includes monitoring a rate of change in current conducted through main terminals of a power switch, determining when the rate of change in the current is faster than a designated detection rate, and responsive to the rate of change in the current exceeding the designated detection rate, lowering a control voltage to an intermediate level within a shortened first time period, followed by increasing the control voltage to an increased level after at least one of expiration of a second time period after the control voltage is lowered to the intermediate level, the rate of change in the current decreases below a first designated threshold, or a voltage across the power switch increases above a second designated threshold. The control voltage is lowered by changing which of plural individually controllable resistive elements in a multi-resistive driving device are active to at least partially conduct a control voltage supplied to a control electrode of the power switch at different times. The method also can include turning off a short circuit current by controlling a decreasing slope of the control voltage after a third designated time period when the voltage across the power switch is above a third designated threshold.

In one aspect, individually activating or deactivating the resistive elements includes individually activating or deactivating switches that are connected with the resistive elements. The switches can be activated or deactivated to conduct or prevent conduction, respectively, of the control voltage applied to the control electrode of the power switch through the resistive elements to divide and reduce the control voltage applied to the control electrode of the power switch.

In one aspect, the method also can include changing which of the switches are activated at different times to divide and reduce the control voltage applied to the control electrode of the power switch by different amounts at the different times.

In one aspect, individually activating or deactivating the resistive elements to control the rate at which the control voltage applied to the control electrode of the power switch decreases when the first voltage across the main terminals of the power switch exceeds a short circuit detection threshold begins after expiration of a designated time period following activation of the power switch.

In one aspect, the method also includes individually activating or deactivating the resistive elements to control the rate at which the control voltage applied to the control electrode of the power switch is decreased responsive to the first voltage across the main terminals of the power switch representing a different, second type of short circuit event. The first voltage across the main terminals of the power switch can represent the second type of short circuit event when the first voltage across the main terminals of the power switch decreases below a short circuit detection threshold when the power switch is closed and then increases above the short circuit detection threshold while the control voltage at the control electrode of the power switch is still configured to close the power switch.

In one aspect, responsive to the first voltage across the main terminals of the power switch representing the second type of short circuit event, the control voltage applied to the control electrode of the power switch is decreased by waiting for a designated delay time period and, upon expiration of the delay time period, and controlling the rate at which the control voltage applied to the control electrode decreases by individually activating or deactivating the resistive elements of the multi-resistive driving device.

In one aspect, the method also includes increasing the control voltage applied to the control electrode of the power switch to an initial activation level when the power switch is activated for at least a designated time period, and increasing the control voltage applied to the control electrode of the power switch above the activation level responsive to the first voltage across the main terminals of the power switch not representing the first type of short circuit event after the designated time period.

In another example of the inventive subject matter described herein, a gate drive unit for operation of a converter includes a measurement unit, a multi-resistive driving device, and a processing unit. The measurement unit is configured to measure a first voltage across main terminals of a power switch. The multi-resistive driving device is configured to be conductively coupled with a control electrode of the power switch that receives a control voltage to activate the power switch. The multi-resistive driving device includes plural individually controllable resistive elements conductively coupled between a voltage source that provides the control voltage and the control electrode of the power switch. The processing unit is configured to individually activate or deactivate the resistive elements of the multi-resistive driving device to divide the control voltage applied to the control electrode of the power switch among different sets of the resistive elements at different times to reduce the control voltage and deactivate the power switch responsive to the first voltage across the main terminals of the power switch indicating a first type of short circuit event. The processing unit is configured to control a rate at which the control voltage decreases during deactivation of the power switch based on a magnitude of the first voltage across the main terminals of the power switch.

In one aspect, the processing unit is configured to increase the rate at which the control voltage is decreased responsive to the first voltage across the main terminals of the power switch being less than a designated magnitude and to decrease the rate at which the control voltage is increased responsive to the first voltage across the main terminals of the power switch being at least as large as the designated magnitude.

In one aspect, the processing unit is configured to change which of the sets of the resistive elements are at least one of activated or deactivated at the different times based on the magnitude of the first voltage across the main terminals of the power switch.

In one aspect, the processing unit is configured to change how long one or more of the sets of the resistive elements are at least one of activated or deactivated based on the magnitude of the first voltage across the main terminals of the power switch.

In one aspect, the multi-resistive driving device includes the resistive elements connected with each other in plural parallel stages between the voltage source and the control electrode of the power switch. The multi-resistive driving device also can include plural switches coupled with the resistive elements. The processing unit can be configured to individually activate or deactivate the switches to conduct or prevent conduction, respectively, of the control voltage through the resistive elements to the control electrode of the power switch to divide and reduce the control voltage.

In one aspect, the processing unit is configured to begin individually activating or deactivating the resistive elements to control the rate at which the control voltage applied to the control electrode of the power switch decreases when the first voltage across the power switch main terminals exceeds a short circuit detection threshold after expiration of a designated time period following activation of the power switch.

In one aspect, the processing unit also is configured to begin individually activating or deactivating the resistive elements to control the rate at which the control voltage applied to the control electrode of the power switch is decreased responsive to the first voltage across the main terminals of the power switch representing a different, second type of short circuit event. The first voltage across the main terminals of the power switch represents the second type of short circuit event when the control voltage across the main terminals of the power switch decreases below a short circuit detection threshold when the power switch is closed and then increases above the short circuit detection threshold while the control voltage at the control electrode of the power switch is still configured to close the power switch.

In one aspect, responsive to the first voltage across the main terminals of the power switch representing the second type of short circuit event, the processing unit is configured to decrease the control voltage applied to the control electrode of the power switch by waiting for a designated delay time period and, upon expiration of the delay time period, controlling the rate at which the control voltage decreases by individually activating or deactivating the resistive elements of the multi-resistive driving device.

In one aspect, the processing unit is configured to control the multi-resistive driving device to increase the control voltage applied to the control electrode of the power switch to an initial activation level, the processing unit also configured to increase the control voltage above the initial activation level responsive to the first voltage across the main terminals of the power switch not representing the first type of short circuit event after the designated time period.

In another embodiment, a method includes detecting a short circuit event after a power switch is turned on, the short circuit event detected at least one of: determining when a voltage across main terminals of the power switch exceeds a threshold after expiration of a time period that begins when the power switch is turned on, determining when a control terminal current flows back into a gate drive unit, or a control voltage of the power switch exceeds a reference voltage, determining when a current through the main terminals exceeds a threshold current, or determining when a rate of change in the current through the main terminals exceeds a threshold rate. The method also includes waiting a designated time period following detection of the short circuit event, and triggering a protective turn-off of the control voltage with controlled decreasing slope of the control voltage. The protective turn-off including reducing the control voltage to at least two different stages. For example the control voltage may be reduced at a controlled rate to a first reduced value, then reduced at the same or different controlled rate to a lower, second reduced value, and so on.

In another embodiment, a method includes detecting a short circuit event involving a power switch and controlling a decreasing rate of change in a control voltage supplied to the power switch in response to the short circuit event.

In one aspect, the method also includes identifying a type of the short circuit event. Timing of when the control voltage is decreased can be based on the type of the short circuit event.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. While the dimensions and types of materials described herein are intended to define the parameters of the inventive subject matter, they are by no means limiting and are exemplary embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

This written description uses examples to disclose several embodiments of the inventive subject matter and also to enable a person of ordinary skill in the art to practice the embodiments of the inventive subject matter, including making and using any devices or systems and performing any incorporated methods. The patentable scope of the inventive subject matter is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The foregoing description of certain embodiments of the inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

What is claimed is:

1. A gate drive unit for operation of a power switch in a converter, wherein the gate drive unit comprises:
   a measurement unit configured to measure a first voltage across main terminals of a power switch;
   a multi-resistive driving device conductively coupled with a control electrode of the power switch, the multi-resistive driving device including plural individually controllable resistive elements conductively coupled between at least one voltage source and the control electrode of the power switch; and
   a processing unit configured to control a control voltage that is applied to the control electrode of the power switch by the voltage source to activate the power switch, the processing unit configured to individually activate or deactivate the resistive elements of the multi-resistive driving device to change which of the resistive elements at least partially conduct the control voltage from the voltage source to the control electrode of the power switch at different times responsive to the first voltage across the main terminals of the power switch representing a first type of short circuit event, the processing unit configured to change which of the resistive elements are activated or deactivated to control a rate at which the control voltage decreases during deactivation of the power switch responsive to a first type of a short circuit event occurring.

2. The gate drive unit of claim 1, wherein the multi-resistive driving device includes the resistive elements connected with each other in plural parallel stages between each voltage source and the control electrode of the power switch, the multi-resistive driving device also including plural switches coupled with the resistive elements, the processing unit configured to individually activate or deactivate the switches to conduct or prevent conduction, respectively, of the control voltage through the resistive elements to the control electrode of the power switch to divide and reduce the control voltage.

3. The gate drive unit of claim 2, wherein the processing unit is configured to change which of the switches are activated at different times to divide and reduce the control voltage applied to the control electrode of the power switch by different amounts at the different times.

4. The gate drive unit of claim 1, wherein the processing unit is configured to begin individually activating or deactivating the resistive elements to control the rate at which the control voltage applied to the control electrode of the power switch decreases when the first voltage across the power switch main terminals exceeds a short circuit detection threshold after expiration of a designated time period following activation of the power switch.

5. The gate drive unit of claim 1, wherein the processing unit also is configured to begin individually activating or deactivating the resistive elements to control the rate at which the control voltage applied to the control electrode of the power switch is decreased responsive to the first voltage across the main terminals of the power switch representing a different, second type of short circuit event, the first voltage across the main terminals of the power switch representing the second type of short circuit event when the voltage across the main terminals of the power switch decreases below a short circuit detection threshold when the power switch is closed and then increases above the short circuit detection threshold while the control voltage at the control electrode of the power switch is still configured to close the power switch.

6. The gate drive unit of claim 5, wherein, responsive to the first voltage across the main terminals of the power switch representing the second type of short circuit event, the processing unit is configured to decrease the control voltage applied to the control electrode of the power switch by waiting for a designated delay time period and, upon expiration of the delay time period, controlling the rate at which the control voltage decreases by individually activating or deactivating the resistive elements of the multi-resistive driving device.

7. The gate drive unit of claim 1, wherein the processing unit is configured to control the multi-resistive driving device to increase the control voltage applied to the control electrode of the power switch to an initial activation level, the processing unit also configured to increase the control voltage above the initial activation level responsive to the first voltage across the main terminals of the power switch not representing the first type of short circuit event after the designated time period.

8. A method comprising:
monitoring a rate of change in current conducted through main terminals of a power switch;
determining when the rate of change in the current is faster than a designated detection rate; and
responsive to the rate of change in the current exceeding the designated detection rate, lowering a control voltage to an intermediate level within a shortened first time period, followed by increasing the control voltage to an increased level after at least one of expiration of a second time period after the control voltage is lowered to the intermediate level, the rate of change in the current decreases below a first designated threshold, or a voltage across the power switch increases above a second designated threshold; and
turning off a short circuit current by controlling a decreasing slope of the control voltage after a third designated time period when the voltage across the power switch is above a third designated threshold, wherein the control voltage is lowered by changing which of plural individually controllable resistive elements in a multi-resistive driving device are active to at least partially conduct a control voltage supplied to a control electrode of the power switch at different times.

9. The method of claim 8, the rate of change in the current through the main terminals of the power switch exceeds the designated detection rate responsive to a second type of short circuit event occurring.

10. A method comprising:
measuring a first voltage across main terminals of a power switch; and
responsive to the first voltage across the main terminals of the power switch representing a first type of short circuit event, decreasing the control voltage at a controlled rate, wherein decreasing the control voltage includes individually activating or deactivating resistive elements of a multi-resistive driving device coupled between a voltage source and a control electrode of the power switch, the resistive elements individually activated or deactivated to change which of the resistive elements at least partially conduct a control voltage from the voltage source to the control electrode of the power switch at different times.

11. The method of claim 10, further comprising changing which of the switches are activated at different times to divide and reduce the control voltage applied to the control electrode of the power switch by different amounts at the different times.

12. The method of claim 10, wherein individually activating or deactivating the resistive elements to control the rate at which the control voltage applied to the control electrode of the power switch decreases when the first voltage across the main terminals of the power switch exceeds a short circuit detection threshold begins after expiration of a designated time period following activation of the power switch.

13. The method of claim 10, further comprising individually activating or deactivating the resistive elements to control the rate at which the control voltage applied to the control electrode of the power switch is decreased responsive to the first voltage across the main terminals of the power switch representing a different, second type of short circuit event, the first voltage across the main terminals of the power switch representing the second type of short circuit event when the first voltage across the main terminals of the power switch decreases below a short circuit detection threshold when the power switch is closed and then increases above the short circuit detection threshold while the control voltage at the control electrode of the power switch is still configured to close the power switch.

14. The method of claim 13, wherein, responsive to the first voltage across the main terminals of the power switch representing the second type of short circuit event, the control voltage applied to the control electrode of the power switch is decreased by waiting for a designated delay time period and, upon expiration of the delay time period, and controlling the rate at which the control voltage applied to the control electrode decreases by individually activating or deactivating the resistive elements of the multi-resistive driving device.

15. The method of claim 10, further comprising increasing the control voltage applied to the control electrode of the power switch to an initial activation level, and increasing the control voltage applied to the control electrode of the power switch above the activation level responsive to the first voltage across the main terminals of the power switch not representing the first type of short circuit event after the designated time period.

16. A gate drive unit for operation of a power switch in a converter, wherein the gate drive unit comprises:

a measurement unit configured to measure a first voltage across main terminals of a power switch;

a multi-resistive driving device configured to be conductively coupled with a control electrode of the power switch that receives a control voltage to activate the power switch, the multi-resistive driving device including plural individually controllable resistive elements conductively coupled between a voltage source that provides the control voltage and the control electrode of the power switch; and a processing unit configured to individually activate or deactivate the resistive elements of the multi-resistive driving device to divide the control voltage applied to the control electrode of the power switch among different sets of the resistive elements at different times to reduce the control voltage and deactivate the power switch responsive to the first voltage across the main terminals of the power switch indicating a first type of short circuit event, the processing unit configured to control a rate at which the control voltage decreases during deactivation of the power switch based on a magnitude of the first voltage across the main terminals of the power switch.

17. The gate drive unit of claim 16, wherein the processing unit is configured to change which of the sets of the resistive elements are at least one of activated or deactivated at the different times based on the magnitude of the first voltage across the main terminals of the power switch.

18. The gate drive unit of claim 16, wherein the processing unit is configured to change one or more of the sets of the resistive elements are at least one of activated or deactivated based on the magnitude of the first voltage across the main terminals of the power switch.

19. The gate drive unit of claim 16, wherein the multi-resistive driving device includes the resistive elements connected with each other in plural parallel stages between at least one voltage source and the control electrode of the power switch, the multi-resistive driving device also including plural switches coupled with the resistive elements, the processing unit configured to individually activate or deactivate the switches to conduct or prevent conduction, respectively, of the supply voltage through the resistive elements to the control electrode of the power switch to divide and reduce the control voltage.

20. The gate drive unit of claim 16, wherein the processing unit is configured to begin individually activating or deactivating the resistive elements to control the rate at which the control voltage applied to the control electrode of the power switch decreases when the first voltage across the power switch main terminals exceeds a short circuit detection threshold after expiration of a designated time period following activation of the power switch.

21. The gate drive unit of claim 16, wherein the processing unit also is configured to begin individually activating or deactivating the resistive elements to control the rate at which the control voltage applied to the control electrode of the power switch is decreased responsive to the first voltage across the main terminals of the power switch representing a different, second type of short circuit event, the first voltage across the main terminals of the power switch representing the second type of short circuit event when the control voltage across the main terminals of the power switch decreases below a short circuit detection threshold when the power switch is closed and then increases above at least one of the short circuit detection threshold or another threshold while the control voltage at the control electrode of the power switch is still configured to close the power switch.

22. The gate drive unit of claim 21, wherein, responsive to the first voltage across the main terminals of the power switch representing the second type of short circuit event, the processing unit is configured to decrease the control voltage applied to the control electrode of the power switch by waiting for a designated delay time period and, upon expiration of the delay time period, controlling the rate at which the control voltage decreases by individually activating or deactivating the resistive elements of the multi-resistive driving device.

23. The gate drive unit of claim 16, wherein the processing unit is configured to control the multi-resistive driving device to increase the control voltage applied to the control electrode of the power switch to an initial activation level, the processing unit also configured to increase the control voltage above the initial activation level responsive to the first voltage across the main terminals of the power switch not representing the first type of short circuit event after the designated time period.

* * * * *

UNITED STATES PATENT AND TRADEMARK OFFICE
CERTIFICATE OF CORRECTION

PATENT NO. : 9,209,618 B2  
APPLICATION NO. : 14/273106  
DATED : December 8, 2015  
INVENTOR(S) : Mari Curbelo et al.

It is certified that error appears in the above-identified patent and that said Letters Patent is hereby corrected as shown below:

In The Specification

In Column 9, Line 34, delete "input lines 218." and insert -- input lines 216. --, therefor.

In Column 9, Line 66, delete "drive" and insert -- driver --, therefor.

In Column 10, Line 1, delete "line 218)," and insert -- line 222), --, therefor.

In Column 10, Line 4, delete "line 220)," and insert -- line 222), --, therefor.

In Column 12, Line 51, delete "voltage 420" and insert -- voltage 402 --, therefor.

Signed and Sealed this  
Twenty-ninth Day of March, 2016

Michelle K. Lee  
*Director of the United States Patent and Trademark Office*